United States Patent
Lee et al.

(10) Patent No.: US 12,347,768 B2
(45) Date of Patent: Jul. 1, 2025

(54) SEMICONDUCTOR DEVICE INCLUDING VIA STRUCTURE

(71) Applicant: SAMSUNG ELECTRONICS CO., LTD., Suwon-si (KR)

(72) Inventors: Anthony Dongick Lee, Hwaseong-si (KR); Sangcheol Na, Seoul (KR); Kichul Park, Suwon-si (KR); Doohwan Park, Yongin-si (KR); Kyoungwoo Lee, Hwaseong-si (KR); Rakhwan Kim, Suwon-si (KR); Yoonsuk Kim, Hwaseong-si (KR); Jinnam Kim, Anyang-si (KR); Hoonjoo Na, Seoul (KR); Eunji Jung, Hwaseong-si (KR); Juyoung Jung, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 379 days.

(21) Appl. No.: 17/961,056

(22) Filed: Oct. 6, 2022

(65) Prior Publication Data
US 2023/0170296 A1    Jun. 1, 2023

(30) Foreign Application Priority Data
Nov. 29, 2021 (KR) .................. 10-2021-0167727

(51) Int. Cl.
*H01L 23/522* (2006.01)
*H01L 23/532* (2006.01)

(52) U.S. Cl.
CPC .... *H01L 23/5226* (2013.01); *H01L 23/53223* (2013.01); *H01L 23/53238* (2013.01); *H01L 23/53266* (2013.01)

(58) Field of Classification Search
CPC ........... H01L 23/5226; H01L 23/53223; H01L 23/53238; H01L 23/53266; H01L 23/528; H01L 23/5283; H01L 27/105; H01L 27/0207; H01L 27/0688; H10D 88/00; H10D 89/10; H10D 84/80
See application file for complete search history.

(56) References Cited

U.S. PATENT DOCUMENTS

| | | |
|---|---|---|
| 8,802,559 B2 | 8/2014 | Yang et al. |
| 8,816,505 B2 | 8/2014 | Mohammed et al. |
| 9,177,858 B1 | 11/2015 | Zhang et al. |
| 9,209,079 B2 | 12/2015 | Chi et al. |
| 10,283,449 B2 | 5/2019 | Mohammed et al. |
| 10,720,385 B2 | 7/2020 | Chen et al. |
| 10,998,238 B2 | 5/2021 | Ching et al. |
| 11,069,566 B2 | 7/2021 | Van Der Straten et al. |
| 2001/0053600 A1 | 12/2001 | Morales et al. |
| 2019/0198426 A1* | 6/2019 | Choi .................. H01L 21/3212 |

(Continued)

*Primary Examiner* — Thanh T Nguyen
(74) *Attorney, Agent, or Firm* — MORGAN, LEWIS & BOCKIUS LLP

(57) ABSTRACT

A semiconductor device includes a substrate. A wiring layer is over the substrate. A first via structure directly contacts a lower portion of the wiring layer. A second via structure directly contacts an upper portion of the wiring layer. The first via structure generates first stress in the wiring layer. The second via structure generates second stress in the wiring layer. The second stress is of an opposite type to the first stress. The first stress and the second stress compensate for each other in the wiring layer.

22 Claims, 19 Drawing Sheets

(56) References Cited

U.S. PATENT DOCUMENTS

2019/0244855 A1    8/2019  Noguchi et al.
2023/0105036 A1*   4/2023  Chen .................. H01L 23/5226
                                                   257/535

* cited by examiner

SEMICONDUCTOR DEVICE INCLUDING VIA STRUCTURE

CROSS-REFERENCE TO RELATED APPLICATION

This application claims priority under 35 U.S.C. § 119 to Korean Patent Application No. 10-2021-0167727, filed on Nov. 29, 2021 in the Korean Intellectual Property Office, the disclosure of which is incorporated by reference in its entirety herein.

1. TECHNICAL FIELD

The present inventive concept relates to a semiconductor device, and more particularly, to a semiconductor device including a via structure.

2. DISCUSSION OF RELATED ART

Semiconductor devices may include multiple wiring layers and via structures electrically connecting the multiple wiring layers to each other. As the level of integration of semiconductor devices increases, critical dimensions (CDs) or pitches of multiple wiring layers may be reduced. Accordingly, voids may be generated in semiconductor devices due to stress between via structures and multiple wiring layers.

SUMMARY

The present inventive concept provides a semiconductor device in which voids are suppressed from being generated between a via structure and multiple wiring layers.

According to an embodiment of the present inventive concept, a semiconductor device includes a substrate. A wiring layer is over the substrate. A first via structure directly contacts a lower portion of the wiring layer. A second via structure directly contacts an upper portion of the wiring layer. The first via structure generates first stress in the wiring layer. The second via structure generates second stress in the wiring layer. The second stress is of an opposite type to the first stress. The first stress and the second stress compensate for each other in the wiring layer.

According to an embodiment of the present inventive concept, a semiconductor device includes a substrate. A lower interlayer insulating layer is over the substrate. A first via structure comprises a first barrier metal layer that is arranged on an inner wall and a bottom of a first via hole, and a first via metal layer that is arranged on the first barrier metal layer to fill the first via hole. The first via hole is defined in the lower interlayer insulating layer. A wiring layer is arranged on the lower interlayer insulating layer and the first via structure. An upper interlayer insulating layer is on the wiring layer. A second via structure comprises a second barrier metal layer that is arranged on an inner wall and a bottom of a second via hole, and a second via metal layer that is arranged on the second barrier metal layer to fill the second via hole. The second via hole is defined in the upper interlayer insulating layer. The first barrier metal layer generates first stress in the wiring layer. The second barrier metal layer generates second stress in the wiring layer. The second stress is an opposite type to the first stress. The first stress and the second stress compensate for each other in the wiring layer.

According to an embodiment of the present inventive concept, a semiconductor device includes a substrate. A first interlayer insulating layer is over the substrate. A first wiring layer is disposed in the first interlayer insulating layer. A second interlayer insulating layer is arranged on the first interlayer insulating layer and the first wiring layer. A first via structure comprises a first barrier metal layer that is arranged on an inner wall and a bottom of a first via hole to directly contact the first wiring layer, and a first via metal layer that is arranged on the first barrier metal layer to fill the first via hole. The first via hole is defined in the second interlayer insulating layer to expose the first wiring layer. A second wiring layer is arranged on the second interlayer insulating layer and the first via structure and directly contacts the first via structure. A third interlayer insulating layer is on the second wiring layer. A second via structure comprises a second barrier metal layer that is arranged on an inner wall and a bottom of a second via hole to directly contact the second wiring layer, and a second via metal layer that is arranged on the second barrier metal layer to fill the second via hole. The second via hole is defined in the third interlayer insulating layer to expose the second wiring layer. A third wiring layer is arranged on the third interlayer insulating layer and the second via structure and directly contacts the second via structure. The first barrier metal layer generates first stress in the second wiring layer. The second barrier metal layer generates second stress in the second wiring layer. The second stress is of an opposite type to the first stress. The first stress and the second stress compensate for each other in the second wiring layer.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Hereinafter, embodiments of the present inventive concept will be described in detail with reference to the accompanying drawings. The present inventive concept may be implemented by only one of the following embodiments or by a combination of one or more of the following embodiments. Therefore, the present inventive concept is not to be construed in any way as being limited to one embodiment.

Figure 1:
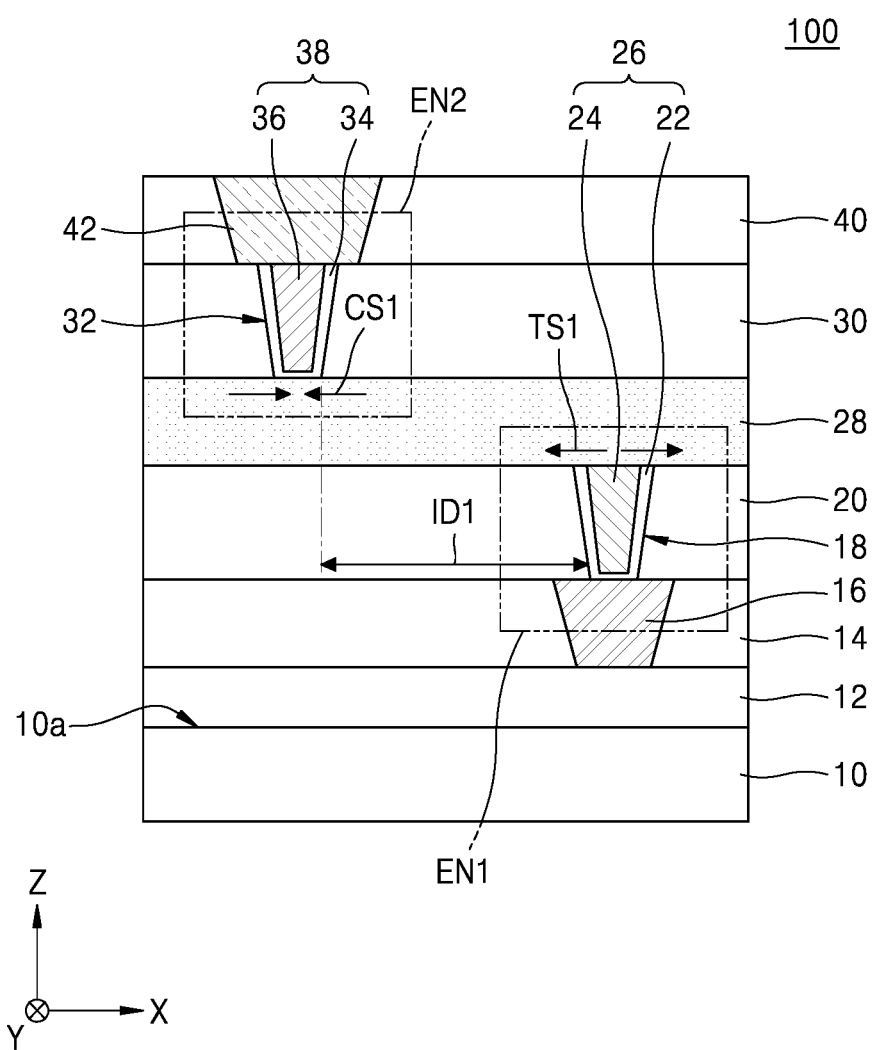
FIG. 1 is a cross-sectional view schematically illustrating a semiconductor device according to an embodiment of the present inventive concept.

FIG. 1 is a cross-sectional view schematically illustrating a semiconductor device according to an embodiment of the present inventive concept.

In an embodiment, a semiconductor device 100 includes a device layer 12 formed on a substrate 10. The semiconductor device 100 may include an integrated circuit semiconductor device. In some embodiments, the substrate 10 may include a silicon substrate. Directions that are parallel to a surface 10a of the substrate 10 (e.g., an upper surface of the substrate) may include a first direction (X direction) and a second direction (Y direction). The first direction (X direction) and the second direction (Y direction) may be perpendicular to each other in the surface 10a of the substrate 10.

A direction that is perpendicular to the surface 10a of the substrate 10 may be a third direction (Z direction). The third direction (Z direction) may be perpendicular to the first direction (X direction) and the second direction (Y direction). However, embodiments of the present inventive concept are not necessarily limited thereto and the first to third directions X, Y, Z directions may cross each other at various different angles. The device layer 12 may include an active element or a passive element. The device layer 12 may include a transistor, a capacitor, a resistor, and the like.

The semiconductor device 100 includes a first interlayer insulating layer 14, a first wiring layer 16, a second interlayer insulating layer 20, and a first via structure 26. The first interlayer insulating layer 14 is formed on the device layer 12. The first wiring layer 16 is formed in the first interlayer insulating layer 14.

In some embodiments, the first interlayer insulating layer 14 may include a silicon oxide layer or a silicon nitride layer. In some embodiments, the first wiring layer 16 may include a copper layer, an aluminum layer, or a tungsten layer.

The second interlayer insulating layer 20 is formed on the first interlayer insulating layer 14 and the first wiring layer 16. In some embodiments, the second interlayer insulating layer 20 may include a silicon oxide layer or a silicon nitride layer.

A first via hole 18 is formed in (e.g., defined in) the second interlayer insulating layer 20 to expose the first wiring layer 16. A first barrier metal layer 22 is formed on an inner wall and a bottom of the first via hole 18 to directly contact the first wiring layer 16. The first barrier metal layer 22 may be referred to as a first barrier adhesive layer or a first seed layer. In some embodiments, the first barrier metal layer 22 may include a tantalum (Ta) film, a tantalum nitride (TaN) film, a titanium (Ti) film, or a titanium nitride (TiN) film.

A first via metal layer 24 is formed on the first barrier metal layer 22 to fill the first via hole 18. The first barrier metal layer 22 may surround the first via metal layer 24. In some embodiments, the first via metal layer 24 may include a copper layer, an aluminum layer, or a tungsten layer. The first barrier metal layer 22 may prevent metal atoms of the first via metal layer 24 from diffusing into the first interlayer insulating layer 14. The first barrier metal layer 22 and the first via metal layer 24 may constitute the first via structure 26.

The semiconductor device 100 may include a second wiring layer 28. The second wiring layer 28 is formed on the second interlayer insulating layer 20 and the first via structure 26 to directly contact the first via structure 26. The second interlayer insulating layer 20 may be referred to as a lower interlayer insulating layer, based on the second wiring layer 28. In some embodiments, the second wiring layer 28 may include a copper layer, an aluminum layer, or a tungsten layer. However, embodiments of the present inventive concept are not necessarily limited thereto.

The first via structure 26 may directly contact a lower portion of the second wiring layer 28 in the third direction (Z direction) that is perpendicular to the surface 10a of the substrate 10. For example, in an embodiment an upper portion of the first via structure 26 may directly contact the lower portion of the second wiring layer 28 in the third direction (Z direction) that is perpendicular to the surface 10a of the substrate 10.

The semiconductor device 100 may include a third interlayer insulating layer 30, a second via structure 38, a fourth interlayer insulating layer 40, and a third wiring layer 42. The third interlayer insulating layer 30 is formed on the second wiring layer 28. In some embodiments, the third interlayer insulating layer 30 may include a silicon oxide layer or a silicon nitride layer. However, embodiments of the present inventive concept are not necessarily limited thereto. The third interlayer insulating layer 30 may be referred to as an upper interlayer insulating layer, based on the second wiring layer 28.

A second via hole 32 is formed in (e.g., defined in) the third interlayer insulating layer 30 to expose the second wiring layer 28. A second barrier metal layer 34 is formed on an inner wall and a bottom of the second via hole 32 to directly contact the second wiring layer 28. For example, in an embodiment, a lower portion of the second barrier metal layer 34 may directly contact an upper portion of the second wiring layer 28.

The second barrier metal layer 34 may be referred to as a second barrier adhesive layer or a second seed layer. In some embodiments, the second barrier metal layer 34 may include a tantalum (Ta) film, a tantalum nitride (TaN) film, a titanium (Ti) film, or a titanium nitride (TiN) film. However, embodiments of the present inventive concept are not necessarily limited thereto.

A second via metal layer 36 is formed on the second barrier metal layer 34 to fill the second via hole 32. The second barrier metal layer 34 may surround the second via metal layer 36. In some embodiments, the second via metal layer 36 may include a copper layer, an aluminum layer, or a tungsten layer. The second barrier metal layer 34 may prevent metal atoms of the second via metal layer 36 from diffusing into the third interlayer insulating layer 30.

The second barrier metal layer 34 and the second via metal layer 36 may constitute the second via structure 38. In some embodiments, the second barrier metal layer 34 and the second via metal layer 36 may be respectively formed of the same films as the first barrier metal layer 22 and the first via metal layer 24. For example, the first barrier metal layer 22 and the second barrier metal layer 34 may be comprised of a same film. The first via metal layer 24 and the second via metal layer 36 may be comprised of a same film.

The second via structure 38 may directly contact an upper portion of the second wiring layer 28 in the third direction (Z direction) that is perpendicular to the surface 10a of the substrate 10. A lower portion of the second via structure 38 may directly contact the upper portion of the second wiring layer 28 in the third direction (Z direction) that is perpendicular to the surface 10a of the substrate 10. The second via structure 38 may be arranged to be spaced apart from the first via structure 26 by as much as an isolation distance ID1 in the first direction (X direction) that is parallel to the surface 10a of the substrate 10.

The fourth interlayer insulating layer 40 is formed on the third interlayer insulating layer 30 and the second via structure 38. The third wiring layer 42 is formed directly on the third interlayer insulating layer 30 and the second via structure 38 to directly contact the second via structure 38. In some embodiments, the fourth interlayer insulating layer 40 may include a silicon oxide layer or a silicon nitride layer. In some embodiments, the third wiring layer 42 may include a copper layer, an aluminum layer, or a tungsten layer. However, embodiments of the present inventive concept are not necessarily limited thereto and the materials of the fourth interlayer insulating layer 40 and the third wiring layer 42 may vary.

In some embodiments, the first via structure 26 constituting the semiconductor device 100 may generate first stress TS1 in the second wiring layer 28. In some embodiments, the first barrier metal layer 22 constituting the semiconductor device 100 may generate the first stress TS1 in the second wiring layer 28.

In some embodiments, the first stress TS1 may be a tensile stress. For example, in an embodiment, the tensile stress may be generated when the first barrier metal layer 22 is formed by an atomic layer deposition (ALD) method or a chemical vapor deposition (CVD) method. The CVD method may include a plasma-enhanced CVD method or a low-pressure CVD method. In some embodiments, the tensile stress may be a positive value Giga Pascal (GPa), for example, in a range of about 1.0 GPa to about 2.0 GPa.

In some embodiments, the second via structure 38 constituting the semiconductor device 100 may generate second stress CS1 in the second wiring layer 28, the second stress CS1 being of an opposite type to the first stress TS1. In some embodiments, the second barrier metal layer 34 constituting the semiconductor device 100 may generate the second stress CS1 in the second wiring layer 28, the second stress CS1 being of an opposite type to the first stress TS1.

In some embodiments, the second stress CS1 may be a compressive stress. The compressive stress may be generated when the second barrier metal layer 34 is formed by a physical vapor deposition (PVD) method. The PVD method may include a sputtering method. In some embodiments, the compressive stress may be generated when the second barrier metal layer 34 is formed by a different deposition method from the deposition method of the first barrier metal layer 22. In some embodiments, the compressive stress may be a negative GPa, for example, in a range of about −1.0 GPa to about −2.0 GPa.

In the semiconductor device 100, the first stress TS1 and the second stress CS1 may compensate for each other in the second wiring layer 28. Accordingly, the semiconductor device 100 may suppress voids from being generated due to stress generated between the first via structure 26 and the second wiring layer 28 and between the second via structure 38 and the second wiring layer 28.

Figure 2A:
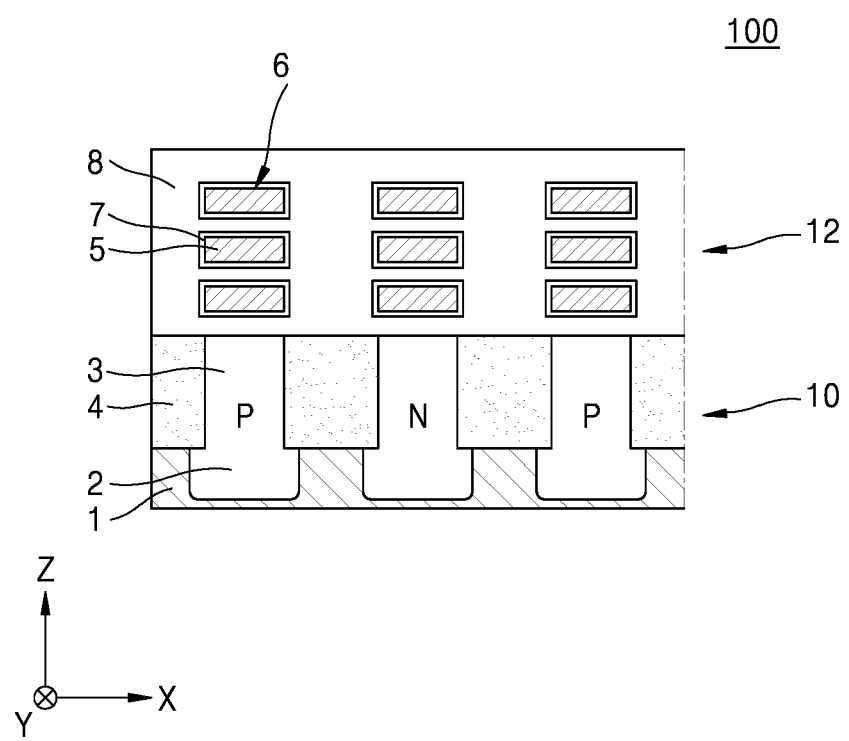
FIG. 2A is a partially enlarged cross-sectional view illustrating respective examples of a substrate and a device layer in FIG. 1 according to an embodiment of the present inventive concept.

FIG. 2A is a partially enlarged cross-sectional view illustrating respective examples of the substrate and the device layer in FIG. 1.

For example, as described above, the semiconductor device 100 includes the device layer 12 formed on the substrate 10. FIG. 2A illustrates respective examples of the substrate 10 and the device layer 12. FIG. 2A illustrates, as an example of the device layer 12, a multi-bridge channel type transistor formed on the substrate 10.

The substrate 10 may include a substrate body 1, a well region 2, an active fin 3, and a device isolation layer 4. In an embodiment, the substrate body 1 may include a semiconductor material such as silicon, germanium, or silicon-germanium, or a Group III-V semiconductor compound such as GaP, GaAs, or GaSb. In an embodiment, the well region 2 may include a PNP region, such as a P-type well region, an N-type well region, and a P-type well region.

The active fin 3 may be formed on the well region 2. The active fin 3 may have a conductivity type that is the same as that of the well region 2. The active fin 3 may be integrated with the substrate body 1 to form one body. The active fin 3 protrudes from the substrate body 1 in the third direction (Z direction). The device isolation layer 4 may be formed around the active fin 3. In an embodiment, the device isolation layer 4 may include a silicon oxide film, a silicon nitride film, or a combination thereof. However, embodiments of the present inventive concept are not necessarily limited thereto.

In an embodiment, the device layer 12 may include a nanosheet-stacked structure 6. The nanosheet-stacked structure 6 may include a plurality of nanosheets 5 spaced apart from each other in the third direction (Z direction). Although FIG. 2A illustrates that three nanosheets 5 are stacked, more than three or less than three nanosheets may be stacked. The nanosheets 5 may each include a silicon layer. A gate dielectric layer 7 is formed to surround the nanosheets 5. A gate electrode 8 is formed on the gate dielectric layer 7 and between the nanosheets 5.

Figure 2B:
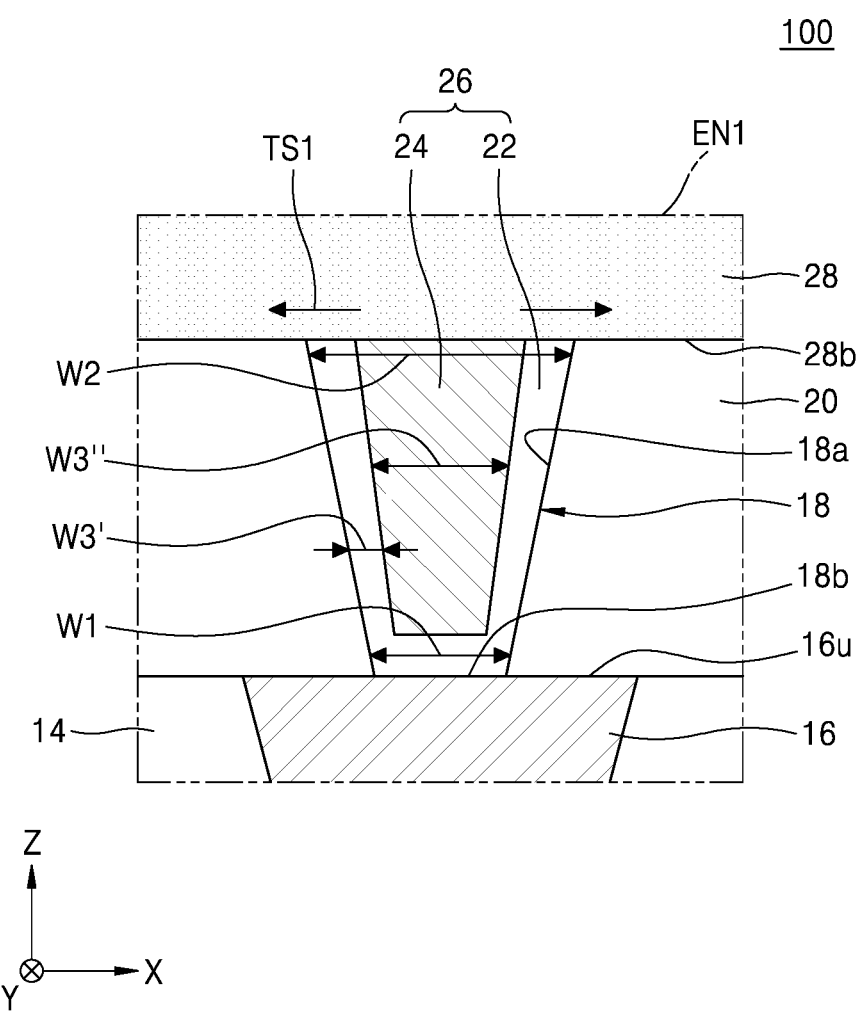
FIG. 2B is an enlarged cross-sectional view of a region EN1 of FIG. 1 according to an embodiment of the present inventive concept.

FIG. 2B is an enlarged cross-sectional view of a region EN1 of FIG. 1.

Specifically, cross-sectional structures of the first wiring layer 16, the first via structure 26, and the second wiring layer 28 will be described with reference to FIG. 2B. FIG. 2B may be a cross-sectional view taken along a line II-IP of FIG. 3 described below.

As shown in FIG. 2B, the first via structure 26 may directly contact some regions of an upper portion 16u of the first wiring layer 16. The first via hole 18 is formed in the second interlayer insulating layer 20 to expose the upper portion 16u of the first wiring layer 16. The first via structure 26 may include the first barrier metal layer 22 on an inner wall 18a and a bottom 18b of the first via hole 18. The first barrier metal layer 22 directly contacts the upper portion 16u of the first wiring layer 16.

The first via structure 26 may include the first via metal layer 24 on the first barrier metal layer 22, the first via metal layer 24 filling the inside of the first via hole 18. The first via structure 26 may include the first barrier metal layer 22 and the first via metal layer 24.

The first via structure 26 may have a lower width W1 and an upper width W2, when viewed from a vertical direction (Z direction) with respect to the surface 10a (see FIG. 1) of the substrate 10 (see FIG. 1). In some embodiments, the upper width W2 may be greater than the lower width W1. Although FIG. 2B illustrates that the upper width W2 is greater than the lower width W1, embodiments of the present inventive concept are not necessarily limited thereto and the upper width W2 may be equal to the lower width W1.

The first barrier metal layer 22 may have a first width (or first thickness) W3' on the inner wall 18a of the first via hole 18. The first via metal layer 24 may have a second width W3" on the first barrier metal layer 222 on the inner wall 18a of the first via hole 18. In some embodiments, the lower width W1, the upper width W2, the first width W3', and the second width W3" may each be in a range of about several nanometers to about several tens of nanometers (nm).

The second wiring layer 28 is formed on the second interlayer insulating layer 20 and the first via structure 26 (e.g., directly thereon in the third direction Z). A lower portion 28b of the second wiring layer 28 may directly contact the first via structure 26. Along with the higher integration of the semiconductor device 100, the volume occupied by the first barrier metal layer 22 in the first via hole 18 may be increased. Accordingly, the first via structure 26, in particular, the first barrier metal layer 22 may generate the first stress TS1 in the second wiring layer 28.

In some embodiments, the first stress TS1 may be tensile stress. As described above, in an embodiment the tensile stress may be generated when the first barrier metal layer 22 is formed by an ALD method or a CVD method.

Figure 3:
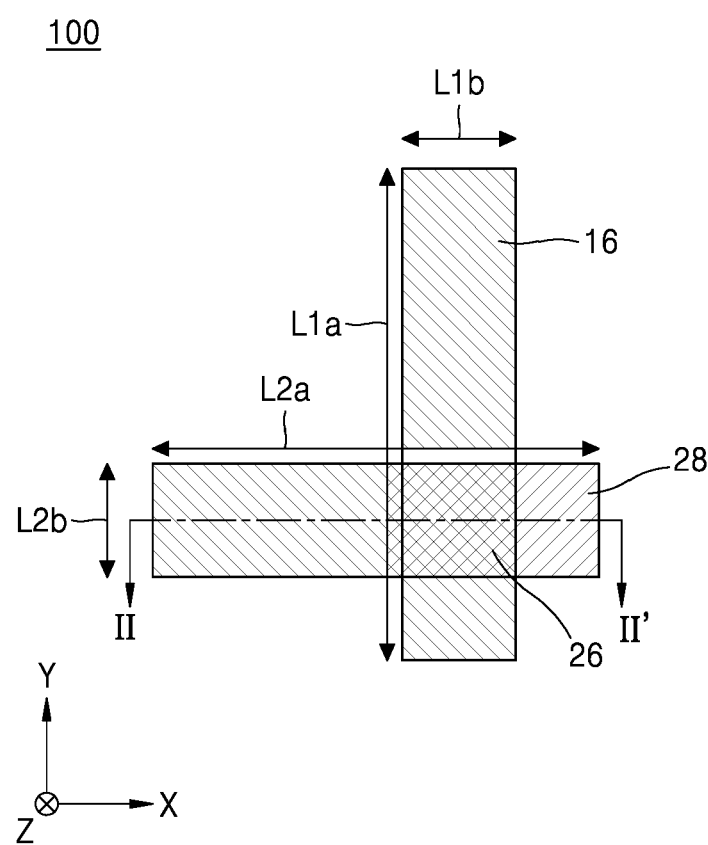
FIG. 3 is a layout diagram of a first wiring layer and a first via structure in FIGS. 1 and 2B according to an embodiment of the present inventive concept.

FIG. 3 is a layout diagram of a first wiring layer and a first via structure in FIGS. 1 and 2B.

In an embodiment, as described above, the semiconductor device 100 may include the first wiring layer 16, the first via structure 26, and the second wiring layer 28. A layout of the first wiring layer 16, the first via structure 26, and the second wiring layer 28 will be described with reference to FIG. 3.

As shown in FIG. 3, the first wiring layer 16 may extend in the second direction (Y direction) over the substrate 10 (see FIG. 1). The first wiring layer 16 may have a major-axis length L1a in the second direction (Y direction) and a minor-axis length L1b in the first direction (X direction). In an embodiment, a plurality of first wiring layers 16 may be arranged to be spaced apart from each other in the first direction (X direction).

The second wiring layer 28 may extend in the first direction (X direction) over the substrate 10 (see FIG. 1). The second wiring layer 28 may have a major-axis length L2a in the first direction (X direction) and a minor-axis length L2b in the second direction (Y direction). In an embodiment, a plurality of second wiring layers 28 may be arranged to be spaced apart from each other in the second direction (Y direction). The first via structure 26 may be arranged in an intersection region between the first wiring layer 16 and the second wiring layer 28.

Figure 4:
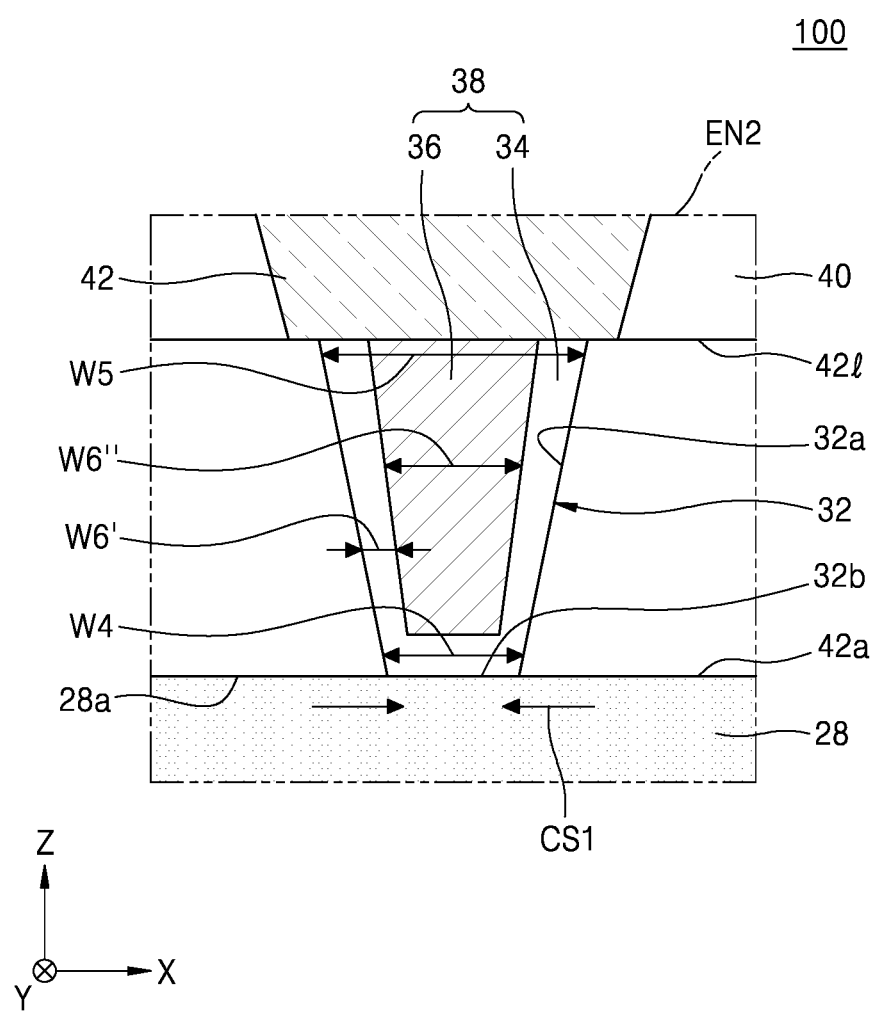
FIG. 4 is an enlarged cross-sectional view of a region EN2 of FIG. 1 according to an embodiment of the present inventive concept.
Figure 5:
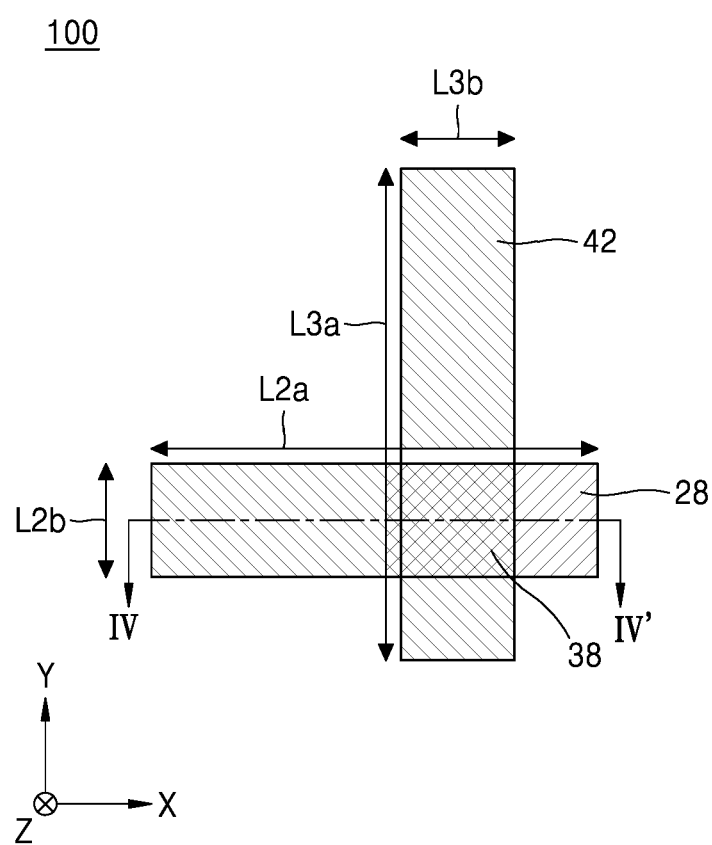
FIG. 5 is a layout diagram of a second wiring layer and a second via structure in FIGS. 1 and 2B according to an embodiment of the present inventive concept.

FIG. 4 is an enlarged cross-sectional view of a region EN2 of FIG. 1, and FIG. 5 is a layout diagram of the second wiring layer and the second via structure in FIGS. 1 and 2B.

In an embodiment, as described above, the semiconductor device 100 may include the second wiring layer 28, the second via structure 38, and the third wiring layer 42. First, a layout of the second wiring layer 28, the second via structure 38, and the third wiring layer 42 will be described with reference to FIG. 5.

As shown in FIG. 5, the second wiring layer 28 may extend in the first direction (X direction) over the substrate 10 (see FIG. 1).

The second wiring layer 28 may have the major-axis length L2a in the first direction (X direction) and the minor-axis length L2b in the second direction (Y direction). In an embodiment, a plurality of second wiring layers 28 may be arranged to be spaced apart from each other in the second direction (Y direction).

The third wiring layer 42 may extend in the second direction (Y direction) over the substrate 10 (see FIG. 1). The third wiring layer 42 may have a major-axis length L3a in the second direction (Y direction) and a minor-axis length L3b in the first direction (X direction). In an embodiment, a plurality of third wiring layers 42 may be arranged to be spaced apart from each other in the first direction (X direction). The second via structure 38 may be arranged in an intersection region between the second wiring layer 28 and the third wiring layer 42.

Next, cross-sectional structures of the second wiring layer 28, the second via structure 38, and the third wiring layer 42 will be described with reference to FIG. 4. FIG. 4 may be a cross-sectional view taken along a line IV-IV' of FIG. 5.

As shown in FIG. 4, the second via structure 38 may directly contact some regions of an upper portion 28a of the second wiring layer 28. The second via hole 32 is formed in the third interlayer insulating layer 30 to expose the upper portion 28a of the second wiring layer 28. The second via structure 38 may include the second barrier metal layer 34 on an inner wall 32a and a bottom 32b of the second via hole 32, the second barrier metal layer 34 directly contacting the upper portion 28a of the second wiring layer 28.

The second via structure 38 may include the second via metal layer 36 on the second barrier metal layer 34, the second via metal layer 36 filling the inside of the second via hole 32. The second via structure 38 may include the second barrier metal layer 34 and the second via metal layer 36.

The second via structure 38 may have a lower width W4 and an upper width W5, when viewed from the vertical direction (Z direction) with respect to the surface 10a (see FIG. 1) of the substrate 10 (see FIG. 1). In some embodiments, the upper width W5 may be greater than the lower width W4. Although FIG. 4 illustrates that the upper width W5 is greater than the lower width W4, embodiments of the present disclosure are not necessarily limited thereto and the upper width W5 may be equal to the lower width W4.

The second barrier metal layer 34 may have a third width (or third thickness) W6' on the inner wall 32a of the second via hole 32. The second via metal layer 36 may have a fourth width W6" on the second barrier metal layer 34 on the inner wall 32a of the second via hole 32. In some embodiments, the lower width W4, the upper width W5, the third width W6', and the fourth width W6" may be in a range of about several nm to about several tens of nm.

The third wiring layer 42 is formed on the third interlayer insulating layer 30 and the second via structure 38. A lower portion 421 of the third wiring layer 42 may directly contact the second via structure 38. Along with the higher integration of the semiconductor device 100, the volume occupied by the second barrier metal layer 34 in the second via hole 32 may be increased. Accordingly, the second via structure 38, in particular, the second barrier metal layer 34 may generate the second stress CS1 in the second wiring layer 28.

In some embodiments, the second stress CS1 may be compressive stress. As described above, in an embodiment the compressive stress may be generated when the second barrier metal layer 34 is formed by a PVD method. The compressive stress may be generated when the second barrier metal layer 34 is formed by a different deposition method from the deposition method of the first barrier metal layer 22.

Figure 6:
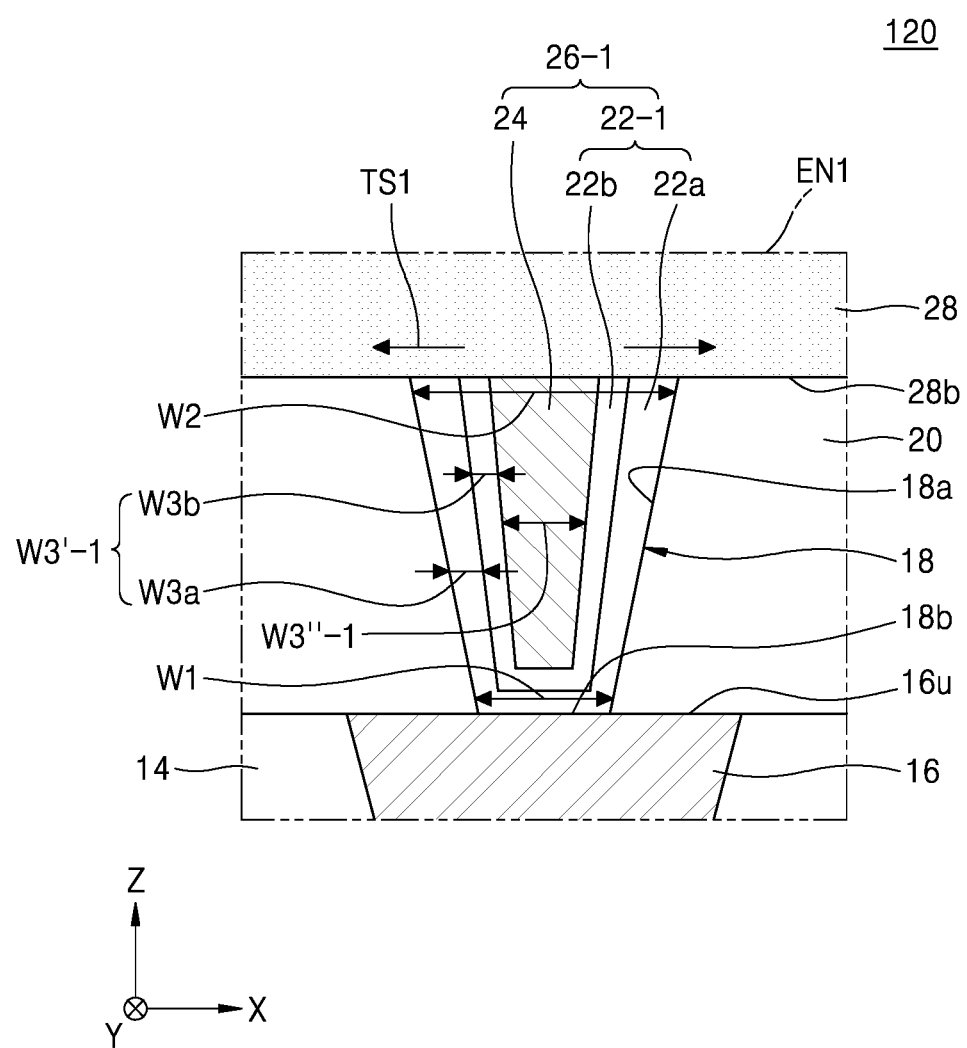
FIG. 6 is a cross-sectional view of a semiconductor device according to an embodiment of the present inventive concept.

FIG. 6 is a cross-sectional view of a semiconductor device according to an embodiment of the present inventive concept.

In an embodiment, a semiconductor device 120 may be the same as the semiconductor device 100 shown in FIG. 2B except that a first barrier metal layer 22-1 includes a plurality of layers, for example, two layers. In FIG. 6, the same reference numerals as in FIG. 2B respectively denote the same members. Regarding FIG. 6, the same descriptions of similar or identical elements as in FIG. 2B are briefly given or are omitted for convenience of explanation.

The semiconductor device 120 may include the first wiring layer 16, a first via structure 26-1, and the second wiring layer 28. The first via structure 26-1 may directly contact some regions of the upper portion 16u of the first wiring layer 16. The first via hole 18 is formed in the second interlayer insulating layer 20 to expose the upper portion 16u of the first wiring layer 16.

The first via structure 26-1 includes the first barrier metal layer 22-1 on the inner wall 18a and the bottom 18b of the first via hole 18, the first barrier metal layer 22-1 directly contacting the upper portion 16u of the first wiring layer 16. The first barrier metal layer 22-1 may include a first sub-barrier metal layer 22a, which is formed on the inner wall 18a and the bottom 18b of the first via hole 18, and a second sub-barrier metal layer 22b, which is formed on the first sub-barrier metal layer 22a, such as an inner wall of the first sub-barrier metal layer 22a.

The first sub-barrier metal layer 22a and the second sub-barrier metal layer 22b are formed of different materials from each other. In an embodiment, the first sub-barrier metal layer 22a and the second sub-barrier metal layer 22b may each include a tantalum (Ta) film, a tantalum nitride (TaN) film, a titanium (Ti) film, or a titanium nitride (TiN) film. However, embodiments of the present inventive concept are not necessarily limited thereto.

In some embodiments, the first sub-barrier metal layer 22a and the second sub-barrier metal layer 22b may respectively include a tantalum (Ta) film and a tantalum nitride (TaN) film. In some embodiments, the first sub-barrier metal layer 22a and the second sub-barrier metal layer 22b may respectively include a titanium (Ti) film and a titanium nitride (TiN) film.

The first via structure 26-1 may include the first via metal layer 24 on the first barrier metal layer 22-1. The first via metal layer 24 fills the inside of the first via hole 18. The first via structure 26-1 may include the first barrier metal layer 22-1 and the first via metal layer 24.

The first via structure 26-1 may have the lower width W1 and the upper width W2, when viewed from the vertical direction with respect to the surface 10a (see FIG. 1) of the substrate 10 (see FIG. 1). In some embodiments, the upper width W2 may be greater than the lower width W1.

The first barrier metal layer 22-1 may have a first width (or first thickness) WY-1 on the inner wall 18a of the first via hole 18. The first sub-barrier metal layer 22a and the second sub-barrier metal layer 22b may respectively have a first sub-width (or first sub-thickness) W3a and a second sub-width (or second sub-thickness) W3b. The first via metal layer 24 may have a second width W3"-1 on the first barrier metal layer 22-1 on the inner wall 18a of the first via hole 18.

The second wiring layer 28 is formed on the second interlayer insulating layer 20 and the first via structure 26-1 (e.g., directly thereon in the third direction Z). The lower portion 28b of the second wiring layer 28 may directly contact the first via structure 26-1. Along with the higher integration of the semiconductor device 100, the volume occupied by the first barrier metal layer 22-1 in the first via hole 18 may be increased. Accordingly, the first via structure 26-1, in particular, the first barrier metal layer 22-1 may generate the first stress TS1 in the second wiring layer 28.

In some embodiments, the first stress TS1 may be tensile stress. As described above, in an embodiment the tensile stress may be generated when the first barrier metal layer 22-1 is formed by an ALD method or a CVD method.

Figure 7:
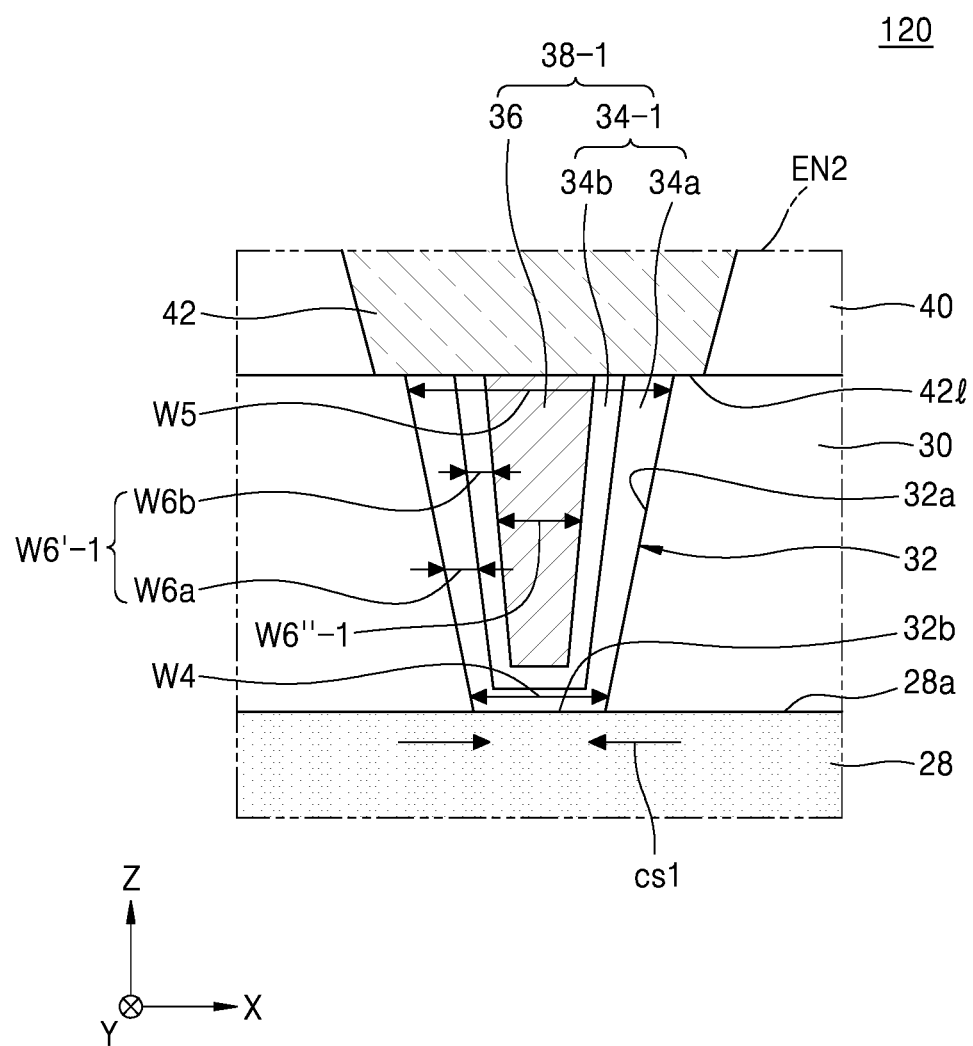
FIG. 7 is a cross-sectional view of a semiconductor device according to an embodiment of the present inventive concept.

FIG. 7 is a cross-sectional view of a semiconductor device according to an embodiment of the present inventive concept.

In an embodiment, the semiconductor device 120 may be the same as the semiconductor device 100 shown in FIG. 4 except that a second barrier metal layer 34-1 includes two layers. In FIG. 7, the same reference numerals as in FIG. 4 respectively denote the same members. Regarding FIG. 7, the same descriptions of similar or identical elements as in FIG. 4 are briefly given or are omitted for convenience of explanation.

The semiconductor device 120 may include the second wiring layer 28, a second via structure 38-1, and the third wiring layer 42. The second via structure 38-1 may directly contact some regions of the upper portion 28a of the second wiring layer 28. The second via hole 32 is formed in the third interlayer insulating layer 30 to expose the upper portion 28a of the second wiring layer 28.

The second via structure 38-1 may include a second barrier metal layer 34-1 on the inner wall 32a and the bottom 32b of the second via hole 32. The second barrier metal layer 34-1 directly contacts the upper portion 28a of the second wiring layer 28. The second barrier metal layer 34-1 may include a third sub-barrier metal layer 34a, which is formed on the inner wall 32a and the bottom 32b of the second via hole 32, and a fourth sub-barrier metal layer 34b, which is formed on the third sub-barrier metal layer 34a, such as inner surfaces of the third sub-barrier metal layer 34a.

The third sub-barrier metal layer 34a and the fourth sub-barrier metal layer 34b may be formed of different materials from each other. In an embodiment, the third sub-barrier metal layer 34a and the fourth sub-barrier metal layer 34b may each include a tantalum (Ta) film, a tantalum nitride (TaN) film, a titanium (Ti) film, or a titanium nitride (TiN) film. However, embodiments of the present inventive concept are not necessarily limited thereto.

In some embodiments, the third sub-barrier metal layer 34a and the fourth sub-barrier metal layer 34b may respectively include a tantalum (Ta) film and a tantalum nitride (TaN) film. In some embodiments, the third sub-barrier metal layer 34a and the fourth sub-barrier metal layer 34b may respectively include a titanium (Ti) film and a titanium nitride (TiN) film.

The second via structure 38-1 may include the second via metal layer 36 on the second barrier metal layer 34-1, the second via metal layer 36 filling the inside of the second via hole 32. The second via structure 38-1 may include the second barrier metal layer 34-1 and the second via metal layer 36.

The second via structure 38-1 may have the lower width W4 and the upper width W5, when viewed from the vertical direction (Z direction) with respect to the surface 10a (see FIG. 1) of the substrate 10 (see FIG. 1). In some embodiments, the upper width W5 may be greater than the lower width W4.

The second barrier metal layer 34-1 may have a third width (or third thickness) W6'-1 on the inner wall 32a of the second via hole 32. The third sub-barrier metal layer 34a and the fourth sub-barrier metal layer 34b may respectively have a third sub-width (or third sub-thickness) W6a and a fourth sub-width (or fourth sub-thickness) W6b. The second via metal layer 36 may have a fourth width W6"-1 on the second barrier metal layer 34-1 on the inner wall 32a of the second via hole 32.

The third wiring layer 42 is formed on the third interlayer insulating layer 30 and the second via structure 38-1 (e.g., directly thereon in the third direction Z). The lower portion 421 of the third wiring layer 42 may directly contact the second via structure 38-1. Along with the higher integration of the semiconductor device 120, the volume occupied by the second barrier metal layer 34-1 in the second via hole 32 may be increased. Accordingly, the second via structure 38-1, in particular, the second barrier metal layer 34-1 may generate the second stress CS1 in the second wiring layer 28.

In some embodiments, the second stress CS1 may be compressive stress. As described above, in an embodiment, the compressive stress may be generated when the second barrier metal layer 34-1 is formed by a PVD method. The compressive stress may be generated when the second barrier metal layer 34-1 is formed by a different deposition method from the deposition method of the first barrier metal layer 22.

Figure 8:
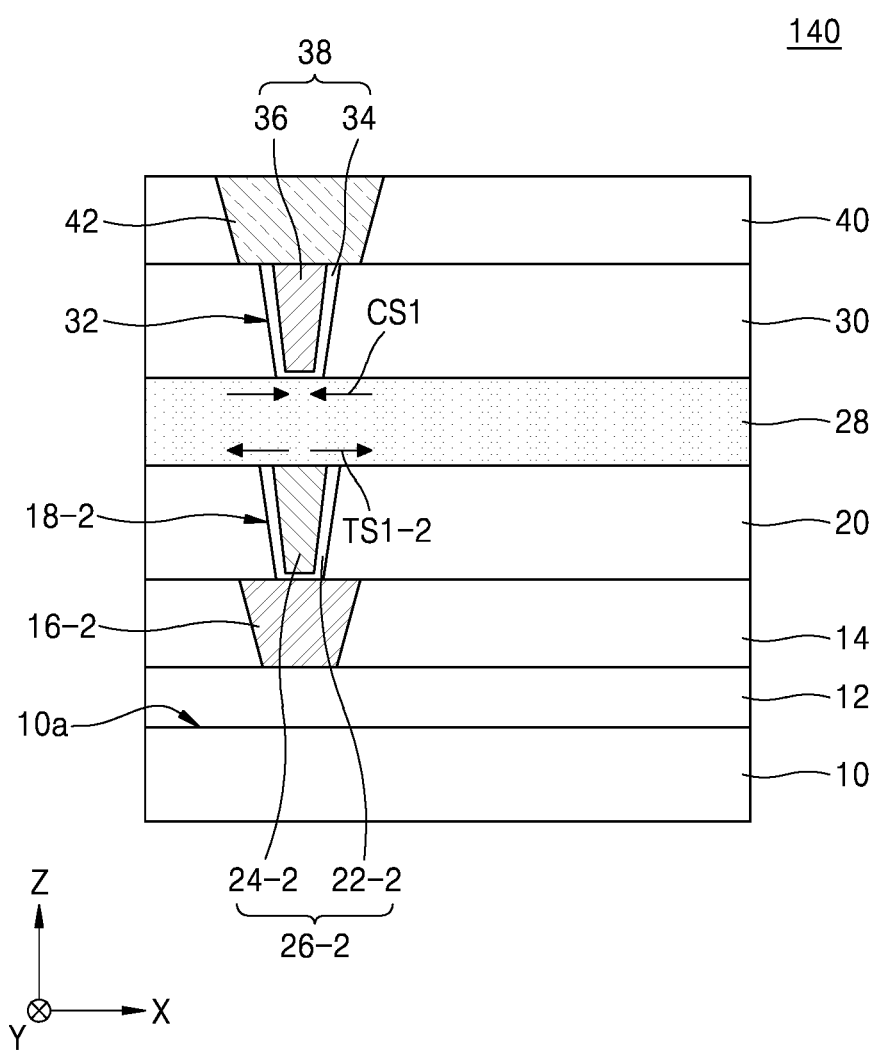
FIG. 8 is a cross-sectional view of a semiconductor device according to an embodiment of the present inventive concept.
Figure 9:
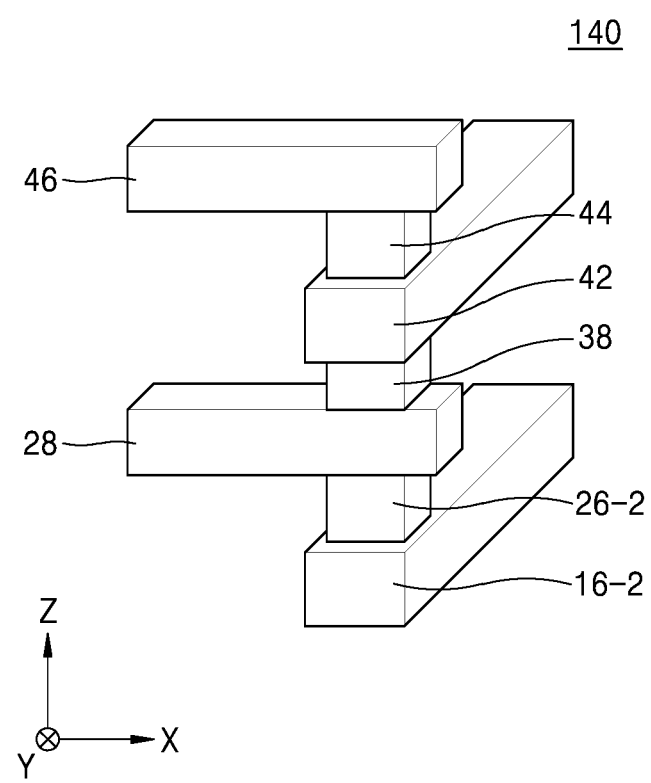
FIG. 9 is a perspective view of FIG. 8 according to an embodiment of the present inventive concept.

FIG. 8 is a cross-sectional view of a semiconductor device according to an embodiment of the present inventive concept, and FIG. 9 is a perspective view of FIG. 8.

In an embodiment, a semiconductor device 140 may be almost the same as the semiconductor device 100 shown in FIG. 1 except that a first via structure 26-2 is arranged to overlap the second via structure 38 in the vertical direction (e.g., the third direction Z). In FIGS. 8 and 9, the same reference numerals as in FIG. 1 respectively denote the same members. Regarding FIGS. 8 and 9, the same descriptions of similar or identical elements as in FIG. 1 are briefly given or are omitted for convenience of explanation.

The semiconductor device 140 includes the device layer 12, the first interlayer insulating layer 14, a first wiring layer 16-2, the second interlayer insulating layer 20, and the first via structure 26-2. The first wiring layer 16-2 is formed in the first interlayer insulating layer 14 in the left area of FIG. 8 (e.g., in the first direction X). However, embodiments of the present inventive concept are not necessarily limited thereto. The first wiring layer 16-2 extends in the second direction (Y direction), as shown in FIG. 9. The second interlayer insulating layer 20 is formed on the first interlayer insulating layer 14 and the first wiring layer 16-2.

A first via hole 18-2 is formed in the second interlayer insulating layer 20 to expose the first wiring layer 16-2. A first barrier metal layer 22-2 is formed on an inner wall and a bottom of the first via hole 18-2 to directly contact the first wiring layer 16-2. A first via metal layer 24-2 is formed on the first barrier metal layer 22-2 to fill the first via hole 18-2. The first barrier metal layer 22-2 and the first via metal layer 24-2 may constitute the first via structure 26-2.

The semiconductor device 140 may include the second wiring layer 28, the third interlayer insulating layer 30, the second via structure 38, the fourth interlayer insulating layer 40, and the third wiring layer 42. The second wiring layer 28 is formed on the first via structure 26-2 and the second interlayer insulating layer 20. The second wiring layer 28 extends in the first direction (X direction), as shown in FIG. 9.

The second wiring layer 28 is formed on the second interlayer insulating layer 20 and the first via structure 26-2 to directly contact the first via structure 26-2. The third interlayer insulating layer 30 is formed on the second wiring layer 28.

The second via hole 32 is formed in the third interlayer insulating layer 30 to expose the second wiring layer 28. The second barrier metal layer 34 is formed on the inner wall and the bottom of the second via hole 32 to directly contact the second wiring layer 28. The second via metal layer 36 is formed on the second barrier metal layer 34 to fill the second via hole 32. The second barrier metal layer 34 and the second via metal layer 36 may constitute the second via structure 38.

The second via structure 38 may be arranged to overlap the first via structure 26-2 in the third direction (Z direction) that is perpendicular to the surface 10a of the substrate 10. The first via structure 26-2 may be arranged to overlap the second via structure 38 in the third direction (Z direction or vertical direction) that is perpendicular to the surface 10a of the substrate 10.

The fourth interlayer insulating layer 40 is formed on the third interlayer insulating layer 30 and the second via structure 38. The third wiring layer 42 is formed on the third interlayer insulating layer 30 and the second via structure 38 to directly contact the second via structure 38. The third wiring layer 42 extends in the second direction (Y direction), as shown in FIG. 9. In some embodiments, a third via structure 44 and a fourth wiring layer 46 may be arranged on the third wiring layer 42, as shown in FIG. 9.

In some embodiments, the first via structure 26-2 constituting the semiconductor device 140 may generate a first stress TS1-2 in the second wiring layer 28. In some embodiments, the first barrier metal layer 22-2 constituting the semiconductor device 140 may generate the first stress TS1-2 in the second wiring layer 28.

In some embodiments, the first stress TS1-2 may be a tensile stress. In an embodiment, the tensile stress may be generated when the first barrier metal layer 22-2 is formed by an ALD method or a CVD method.

In some embodiments, the second via structure 38 constituting the semiconductor device 140 may generate the second stress CS1, which is of an opposite type to the first stress TS1-2, in the second wiring layer 28. In some embodiments, the second barrier metal layer 34 constituting the semiconductor device 140 may generate the second stress CS1, which is of an opposite type to the first stress TS1-2, in the second wiring layer 28.

In some embodiments, the second stress CS1 may be a compressive stress. In an embodiment, the compressive stress may be generated when the second barrier metal layer 34 is formed by a PVD method. The compressive stress may be generated when the second barrier metal layer 34 is formed by a different deposition method from the deposition method of the first barrier metal layer 22.

In the semiconductor device 140, the first stress TS1-2 and the second stress CS1 may compensate for each other in the second wiring layer 28. Accordingly, the semiconductor device 140 may suppress voids from being generated due to stress generated between the first via structure 26-2 and the second wiring layer 28 and between the second via structure 38 and the second wiring layer 28.

Figure 10:
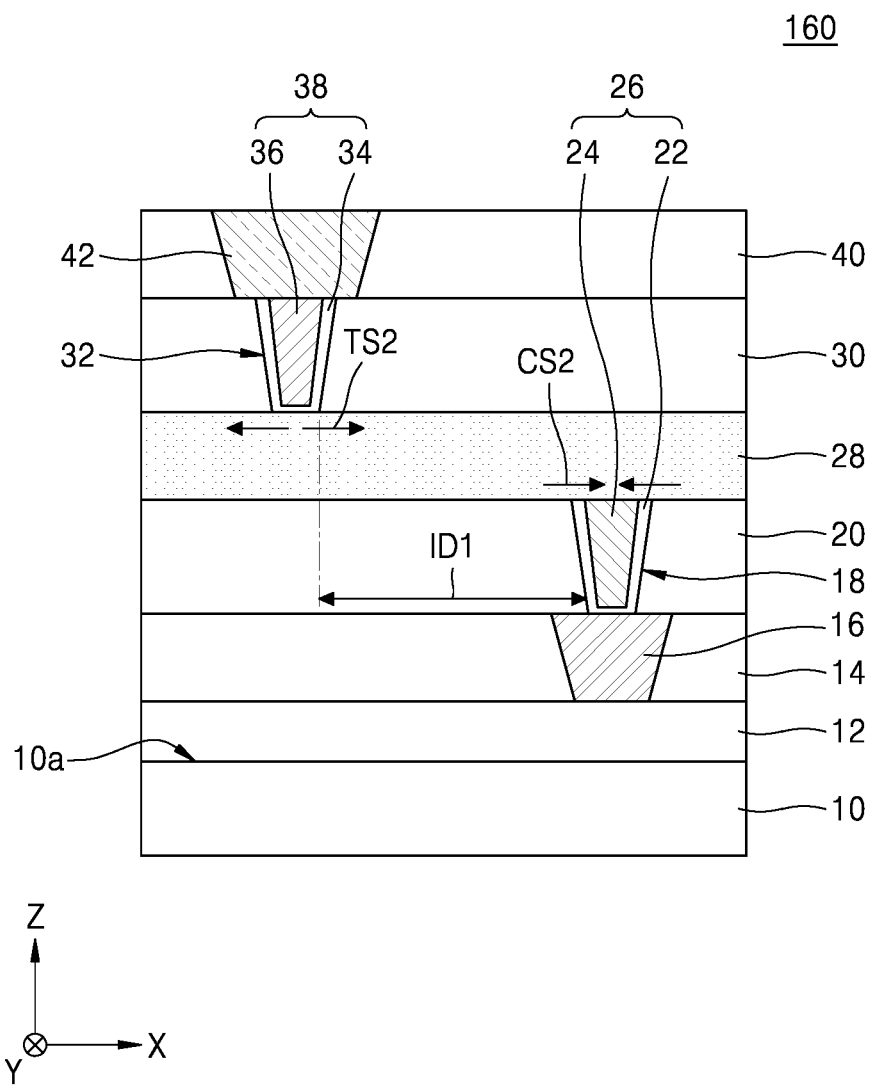
FIG. 10 is a cross-sectional view of a semiconductor device according to an embodiment of the present inventive concept.

FIG. 10 is a cross-sectional view of a semiconductor device according to an embodiment of the present inventive concept.

In an embodiment, a semiconductor device 160 may be the same as the semiconductor device 100 shown in FIG. 1 except that first stress CS2 generated in the second wiring layer 28 by the first via structure 26 and second stress TS2 generated in the second wiring layer 28 by the second via structure 38 are different from those in the semiconductor device 100 shown in FIG. 1. In FIG. 10, the same reference numerals as in FIG. 1 respectively denote the same members. Regarding FIG. 10, the same descriptions of similar or identical elements as in FIG. 1 are briefly given or are omitted for convenience of explanation.

The semiconductor device 160 may include the device layer 12, the first interlayer insulating layer 14, the first wiring layer 16, the second interlayer insulating layer 20, and the first via structure 26, which are formed on or over the substrate 10. In addition, the semiconductor device 160 may include the second wiring layer 28, the third interlayer insulating layer 30, the second via structure 38, the fourth interlayer insulating layer 40, and the third wiring layer 42.

In some embodiments, the first via structure 26 constituting the semiconductor device 160 may generate the first stress CS2 in the second wiring layer 28. For example, in some embodiments, the first barrier metal layer 22 constituting the semiconductor device 160 may generate the first stress CS2 in the second wiring layer 28. In some embodiments, the first stress CS2 may be compressive stress. In an embodiment, the compressive stress may be generated when the first barrier metal layer 22 is formed by a PVD method.

In some embodiments, the second via structure 38 constituting the semiconductor device 160 may generate the second stress TS2, which is of an opposite type to the first stress CS2, in the second wiring layer 28. In some embodiments, the second barrier metal layer 34 constituting the semiconductor device 160 may induce the second stress TS2, which is of an opposite type to the first stress CS2, in the second wiring layer 28.

In some embodiments, the second stress TS2 may be tensile stress. In an embodiment, the tensile stress may be generated when the second barrier metal layer 34 is formed by an ALD method or a CVD method. The tensile stress may be generated when the second barrier metal layer 34 is formed by a different deposition method from the deposition method of the first barrier metal layer 22.

In the semiconductor device 160, the first stress CS2 and the second stress TS2 may compensate for each other in the second wiring layer 28. Accordingly, the semiconductor device 160 may suppress voids from being generated due to stress generated between the first via structure 26 and the second wiring layer 28 and between the second via structure 38 and the second wiring layer 28.

Figure 11:
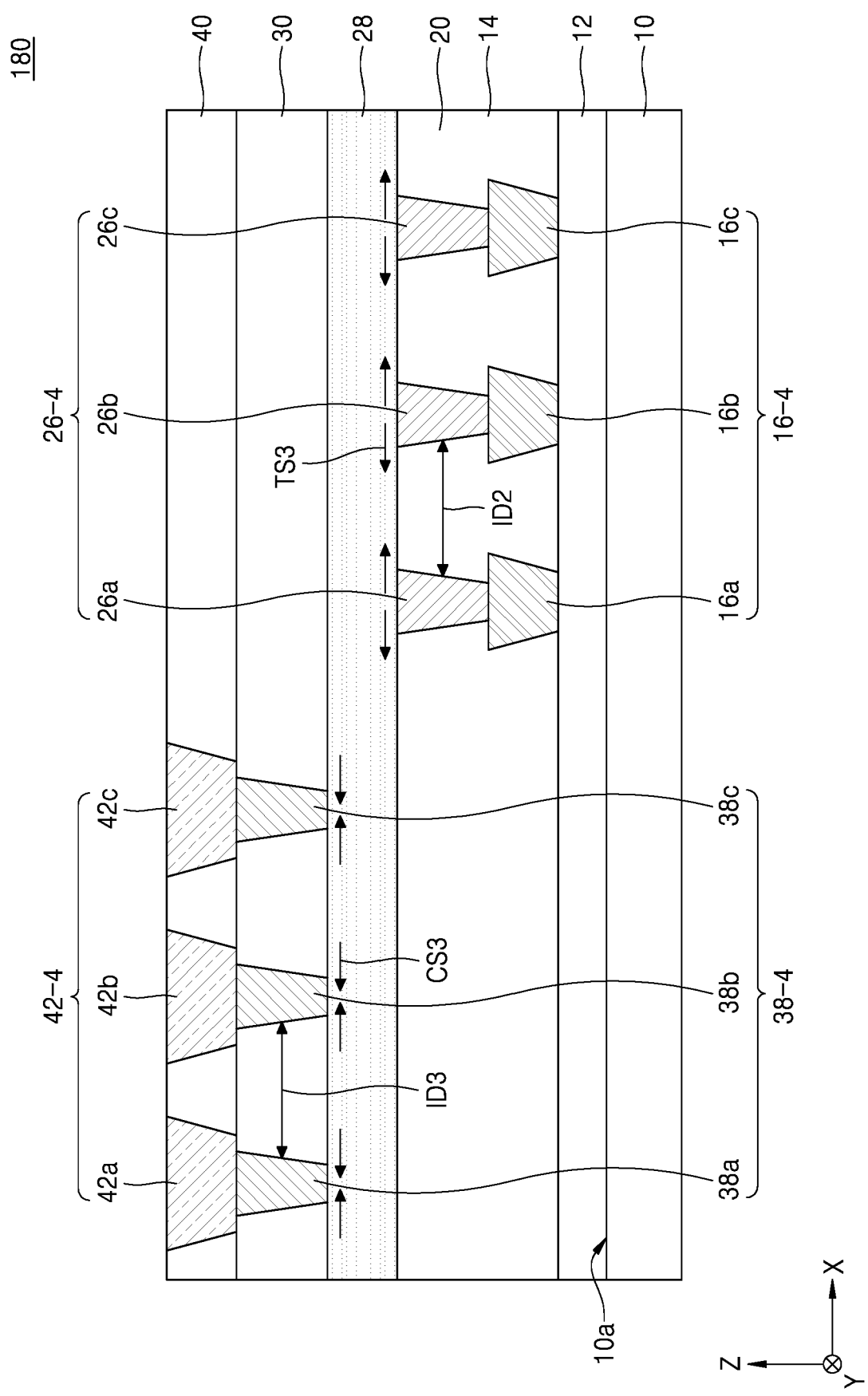
FIG. 11 is a cross-sectional view of a semiconductor device according to an embodiment of the present inventive concept.

FIG. 11 is a cross-sectional view of a semiconductor device according to an embodiment of the present inventive concept.

In an embodiment, a semiconductor device 180 may be the same as the semiconductor device 100 shown in FIG. 1 except that a first via structure 26-4 includes a plurality of first sub-via structures 26a, 26b, and 26c and a second via structure 38-4 includes a plurality of second sub-via structures 38a, 38b, and 38c. In FIG. 11, the same reference numerals as in FIG. 1 respectively denote the same members. Regarding FIG. 11, the same descriptions of similar or identical elements as in FIG. 1 are briefly given or are omitted for convenience of explanation.

The semiconductor device 180 may include the device layer 12, the first interlayer insulating layer 14, a first wiring layer 16-4, the second interlayer insulating layer 20, and a first via structure 26-4, which are formed on or over the substrate 10. The first wiring layer 16-4 may include a plurality of first sub-wiring layers 16a, 16b, and 16c spaced apart from each other (e.g., in the first direction X). The first via structure 26-4 may include the plurality of first sub-via structures 26a, 26b, and 26c. The first sub-via structures 26a, 26b, and 26c may be respectively formed on the first sub-wiring layers 16a, 16b, and 16c. While an embodiment of FIG. 11 shows three first sub-via structures 26a, 26b, and 26c, embodiments of the present inventive concept are not necessarily limited thereto and the number of the first sub-via structures may vary.

The semiconductor device 180 may include the second wiring layer 28, the third interlayer insulating layer 30, the second via structure 38-4, the fourth interlayer insulating layer 40, and a third wiring layer 42-4. The second via structure 38-4 may include the plurality of second sub-via structures 38a, 38b, and 38c. The third wiring layer 42-4 may include a plurality of third sub-wiring layers 42a, 42b, and 42c spaced apart from each other (e.g., in the first direction X). The third sub-wiring layers 42a, 42b, and 42c may be respectively formed on the second sub-via structures 38a, 38b, and 38c. While an embodiment of FIG. 11 shows three second sub-via structures 38a, 38b, and 38c, embodiments of the present inventive concept are not necessarily limited thereto and the number of the second sub-via structures may vary.

In some embodiments, the first via structure 26-4 constituting the semiconductor device 180 may generate first stress TS3 in the second wiring layer 28. Each of the first sub-via structures 26a, 26b, and 26c may generate the first stress TS3 in the second wiring layer 28. In some embodiments, the first stress TS3 may be tensile stress. In an embodiment, the tensile stress may be generated when the first via structure 26-4, that is, the first barrier metal layer 22 (see FIG. 1) is formed by an ALD method or a CVD method.

In some embodiments, the second via structure 38-4 constituting the semiconductor device 180 may generate second stress CS3, which is of an opposite type to the first stress TS3, in the second wiring layer 28. Each of the second sub-via structures 38a, 38b, and 38c may generate the second stress CS3.

In some embodiments, the second stress CS3 may be compressive stress. In an embodiment, the compressive stress may be generated when the second via structure 38-4, that is, the second barrier metal layer 34 (see FIG. 1) is formed by a PVD method. The compressive stress may be generated when the second via structure 38-4 is formed by a different deposition method from the deposition method of the first barrier metal layer 22 (see FIG. 1) constituting the first via structure 26-4.

In the semiconductor device 180, the first stress TS3 and the second stress CS3 may compensate for each other in the second wiring layer 28. Accordingly, the semiconductor device 180 may suppress voids from being generated due to stress generated between the first via structure 26-4 and the second wiring layer 28 and between the second via structure 38-4 and the second wiring layer 28.

FIGS. 12 to 16 are cross-sectional views illustrating a method of manufacturing a semiconductor device, according to embodiments of the present inventive concept.

FIGS. 12 to 16 are provided to describe a method of manufacturing the semiconductor device 100 of FIGS. 1 to 5. In FIGS. 12 to 16, the same reference numerals as in FIGS. 1 to 5 respectively denote the same members. Regarding FIGS. 12 to 16, the same descriptions as similar or identical elements in FIGS. 1 to 5 are briefly given or are omitted for convenience of explanation.

Figure 12:
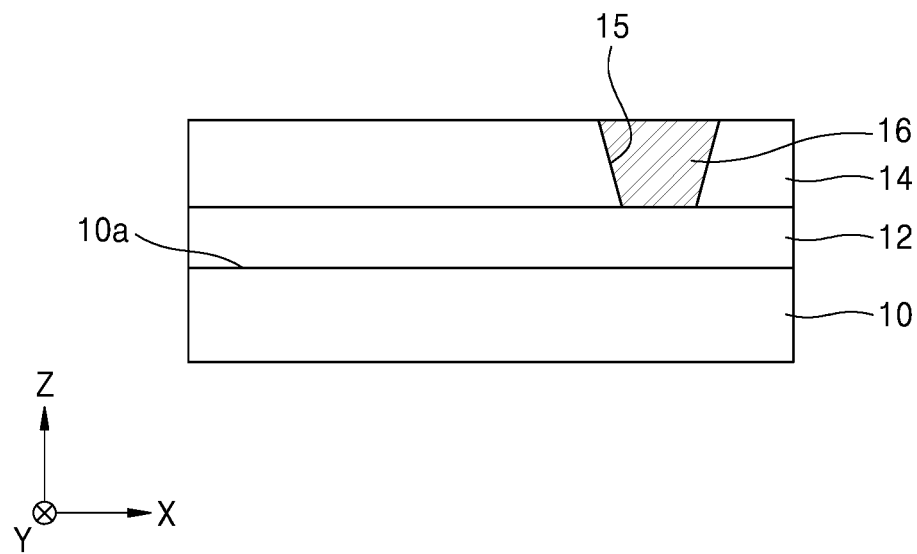
FIGS. 12 to 16 are cross-sectional views illustrating a method of manufacturing a semiconductor device, according to embodiments of the present inventive concept.

Referring to FIG. 12, the device layer 12 is formed on the surface 10a of the substrate 10. In an embodiment, the device layer 12 may include a transistor, a capacitor, a resistor, and the like. The first interlayer insulating layer 14 is formed on the device layer 12.

In an embodiment, a contact hole 15 is formed by patterning the first interlayer insulating layer 14 by a photolithography process. Next, a first metal material film is formed on the first interlayer insulating layer 14 to fill the contact hole 15, followed by planarizing the first metal material film, thereby forming the first wiring layer 16. In some embodiments, the first wiring layer 16 is formed of a copper layer, an aluminum layer, or a tungsten layer. However, embodiments of the present inventive concept are not necessarily limited thereto. The first wiring layer 16 is formed in the first interlayer insulating layer 14. In some embodiments, the first wiring layer 16 may be formed by a damascene process.

Figure 13:
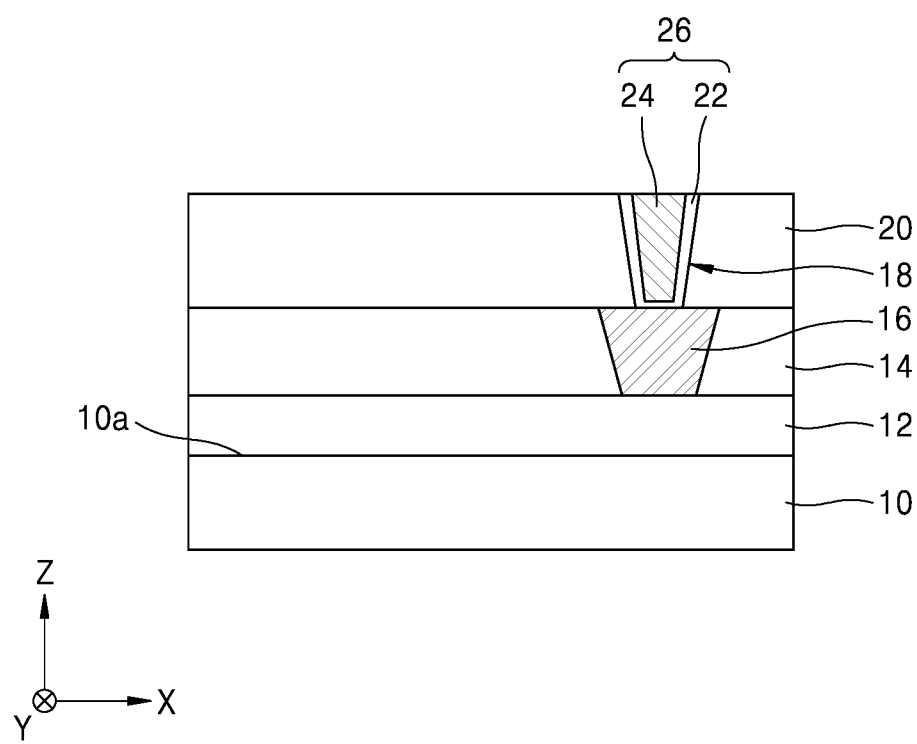

Referring to FIG. 13, the second interlayer insulating layer 20 is formed on the first interlayer insulating layer 14 and the first wiring layer 16 (e.g., formed directly thereon in the third direction Z). In an embodiment, the first via hole 18 is formed by patterning the second interlayer insulating layer 20 by a photolithography process. The first via hole 18 may expose a surface of the first wiring layer 16.

The first barrier metal layer 22 is formed on the inner wall 18a (see FIG. 2B) and the bottom 18b (see FIG. 2B) of the first via hole 18. In some embodiments, the first barrier metal layer 22 is formed of a tantalum (Ta) film, a tantalum nitride (TaN) film, a titanium (Ti) film, or a titanium nitride (TiN) film. However, embodiments of the present inventive concept are not necessarily limited thereto.

The first barrier metal layer 22 may directly contact the first wiring layer 16. The first via metal layer 24 is formed on the first barrier metal layer 22 to fill the first via hole 18. In some embodiments, the first via metal layer 24 is formed of a copper layer, an aluminum layer, or a tungsten layer. However, embodiments of the present inventive concept are not necessarily limited thereto. The first barrier metal layer 22 and the first via metal layer 24 constitute the first via structure 26.

In an embodiment, the first barrier metal layer 22 and the first via metal layer 24 may be formed by forming a first barrier metal material film and a first via metal material film in the stated order on the second interlayer insulating layer 20, in which the first via hole 18 is formed, and then by planarizing the first via metal material film and the first barrier metal material film.

In some embodiments, the first barrier metal layer 22 is formed by an ALD method or a CVD method. In some embodiments, the first via metal layer 24 is formed by an ALD method or a CVD method. In some embodiments, when the first barrier metal layer 22 is formed by an ALD method or a CVD method, the first via structure 26 including the first barrier metal layer 22 may generate a first stress TS1, such as tensile stress in the second wiring layer 28 (see FIG. 14), as described below.

Figure 14:
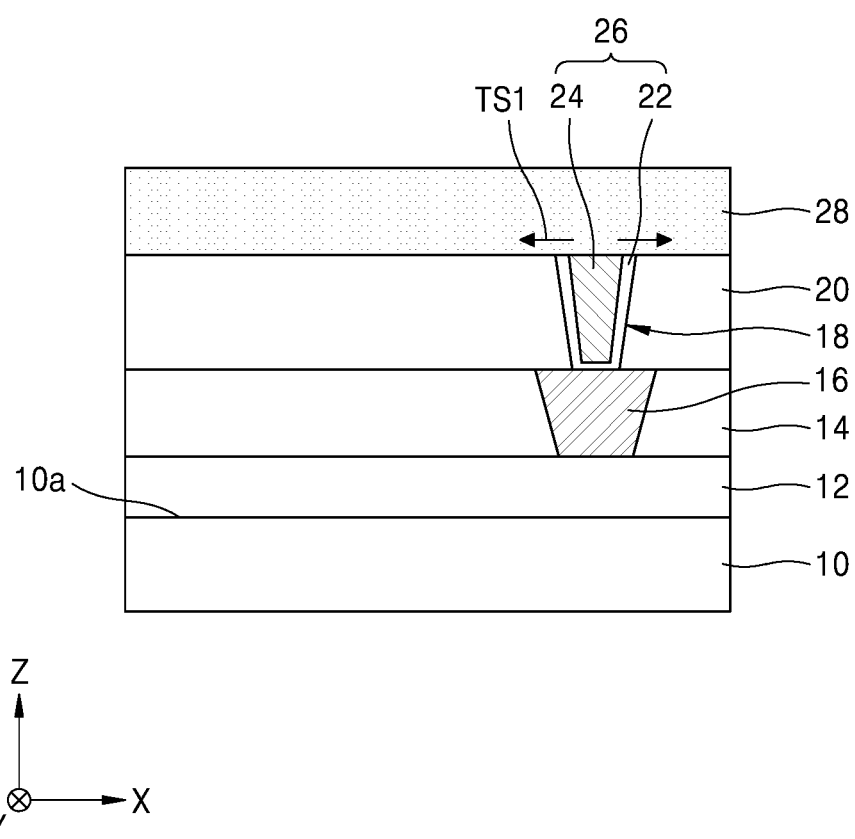

Referring to FIG. 14, the second wiring layer 28 is formed on the second interlayer insulating layer 20 and the first via structure 26. The second wiring layer 28 may extend in the first direction (X direction) that is parallel to the surface 10a of the substrate 10, as shown in FIGS. 3 and 5.

In an embodiment, the second wiring layer 28 may be formed by forming a second metal material film on the second interlayer insulating layer 20 and the first via structure 26 and then by patterning the second metal material film. In some embodiments, the second wiring layer 28 may be formed of a copper layer, an aluminum layer, or a tungsten layer. However, embodiments of the present inventive concept are not necessarily limited thereto. In some embodiments, the second wiring layer 28 may be formed by a damascene process.

The second wiring layer 28 may directly contact the first via structure 26. The lower portion of the second wiring layer 28 may directly contact the upper portion of the first via structure 26 in the third direction (Z direction) that is perpendicular to the surface 10a of the substrate 10. As described above, the first via structure 26 including the first barrier metal layer 22 may generate a first stress TS1, such as tensile stress in the second wiring layer 28.

Figure 15:
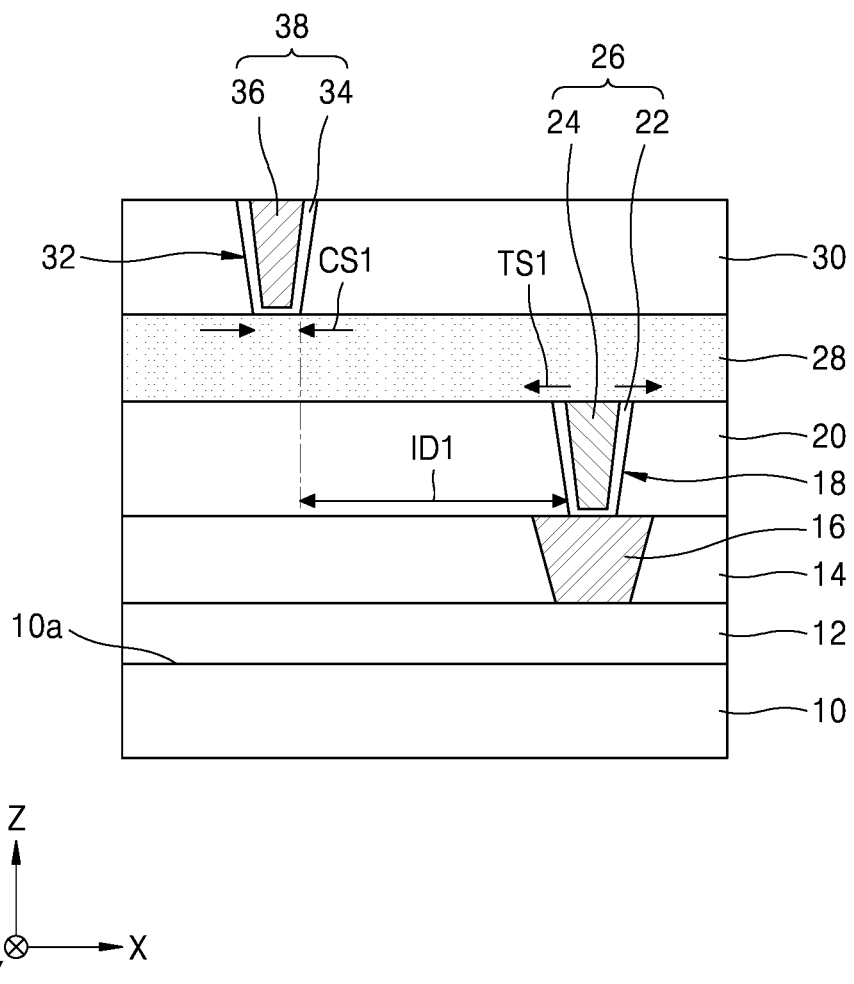

Referring to FIG. 15, the third interlayer insulating layer 30 is formed on the second wiring layer 28. In an embodiment, the second via hole 32 is formed by patterning the third interlayer insulating layer 30 by a photolithography process. The second via hole 32 may expose a surface of the second wiring layer 28.

The second barrier metal layer 34 is formed on the inner wall 32a (see FIG. 4) and the bottom 32b (see FIG. 4) of the second via hole 32. In some embodiments, the second barrier metal layer 34 may be formed of a tantalum (Ta) film, a tantalum nitride (TaN) film, a titanium (Ti) film, or a titanium nitride (TiN) film. However, embodiments of the present inventive concept are not necessarily limited thereto. The second barrier metal layer 34 may directly contact the second wiring layer 28.

The second via metal layer 36 is formed on the second barrier metal layer 34 to fill the second via hole 32. In some embodiments, the second via metal layer 36 is formed of a copper layer, an aluminum layer, or a tungsten layer. However, embodiments of the present inventive concept are not necessarily limited thereto. The second barrier metal layer 34 and the second via metal layer 36 constitute the second via structure 38.

In some embodiments, the second barrier metal layer 34 and the second via metal layer 36 are respectively formed of the same materials as the first barrier metal layer 22 and the first via metal layer 24. The second via structure 38 is arranged to be spaced apart from the first via structure 26 by as much as the isolation distance ID1 in the first direction (X direction) that is parallel to the surface 10a of the substrate 10.

In an embodiment, the second barrier metal layer 34 and the second via metal layer 36 may be formed by forming a second barrier metal material film and a second via metal material film in the stated order on the third interlayer insulating layer 30, in which the second via hole 32 is formed, and then by planarizing the second via metal material film and the second barrier metal material film.

In some embodiments, the second barrier metal layer 34 is formed by a PVD method. In some embodiments, the second via metal layer 36 is formed by a PVD method. In some embodiments, when the second barrier metal layer 34 is formed by a PVD method, the second via structure 38 including the second barrier metal layer 34 may generate the second stress CS1, such as a compressive stress, which is of an opposite type to the first stress TS1, in the second wiring layer 28.

The first stress TS1 and the second stress CS1 may compensate for each other in the second wiring layer 28.

Accordingly, voids may be suppressed from being generated due to stress generated between the first via structure 26 and the second wiring layer 28 and between the second via structure 38 and the second wiring layer 28.

Figure 16:
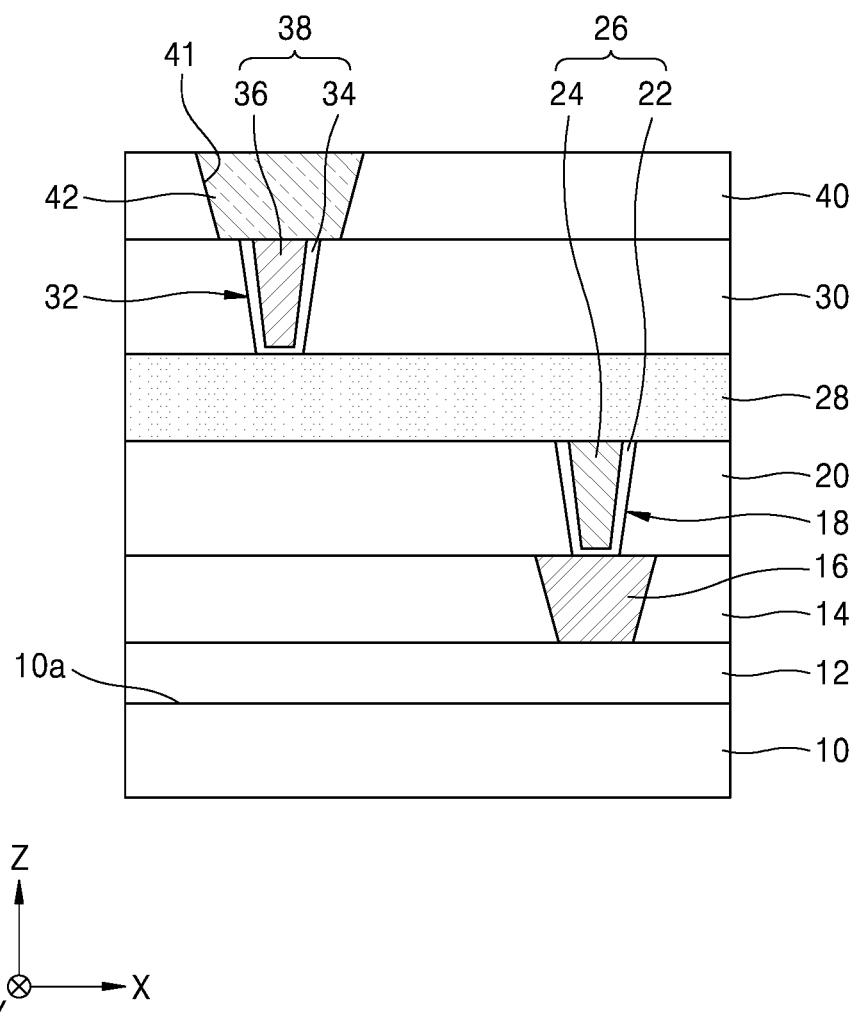

Referring to FIG. 16, the fourth interlayer insulating layer 40 is formed on the third interlayer insulating layer 30 and the second via structure 38. A contact hole 41 is formed by patterning the fourth interlayer insulating layer 40 by a photolithography process.

Next, in an embodiment a third metal material film is formed on the fourth interlayer insulating layer 40 to fill the contact hole 41, followed by planarizing the third metal material film, thereby forming the third wiring layer 42. In some embodiments, the third wiring layer 42 is formed of a copper layer, an aluminum layer, or a tungsten layer. However, embodiments of the present inventive concept are not necessarily limited thereto. The third wiring layer 42 is formed in the fourth interlayer insulating layer 40. The third wiring layer 42 may directly contact the second via structure 38. In some embodiments, the third wiring layer 42 may be formed by a damascene process.

Figure 17:
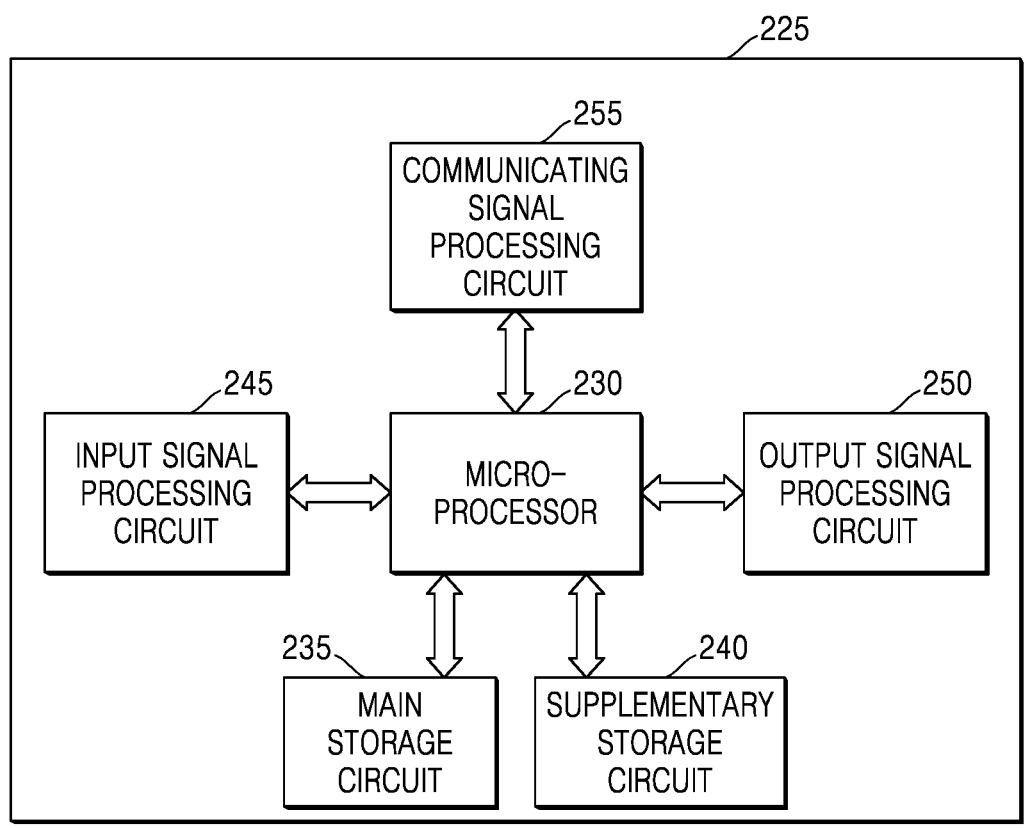
FIG. 17 is a block diagram schematically illustrating an electronic circuit board including a semiconductor device, according to an embodiment of the present inventive concept.

FIG. 17 is a block diagram schematically illustrating an electronic circuit board including a semiconductor device, according to an embodiment of the present inventive concept.

In an embodiment an electronic circuit board 200 includes: a microprocessor 230 arranged on a circuit board 225; a main storage circuit 235 and a supplementary storage circuit 240, which communicate with the microprocessor 230; an input signal processing circuit 245 transmitting a command to the microprocessor 230; an output signal processing circuit 250 receiving a command from the microprocessor 230; and a communicating signal processing circuit 255 exchanging signals with other circuit boards. The arrows shown in FIG. 17 may be understood as representing paths through which electrical signals may be transferred.

The microprocessor 230 may receive and process various electrical signals and output processing results, and may control other components of the electronic circuit board 200. In an embodiment, the microprocessor 230 may be, for example, a central processing unit (CPU) and/or a main control unit (MCU).

The main storage circuit 235 may temporarily store data, which is always or frequently required by the microprocessor 230, or data before and after processing. Because the main storage circuit 235 requires a high-speed response, the main storage circuit 235 may include a semiconductor memory chip. For example, in an embodiment the main storage circuit 235 may include a semiconductor memory referred to as a cache, or may include static random access memory (SRAM), dynamic random access memory (DRAM), resistive random access memory (RRAM), and application semiconductor memories thereof, for example, Utilized RAM, Ferro-electric RAM, Fast cycle RAM, Phase changeable RAM, Magnetic RAM, and other semiconductor memories.

In addition, the main storage circuit 235 is irrelevant to being volatile/non-volatile and may include random access memory. In an embodiment, the main storage circuit 235 may include a semiconductor device. The supplementary storage circuit 240 is a mass storage device and may include a volatile semiconductor memory such as flash memory or include a hard disk drive using a magnetic field. Alternatively, the supplementary storage circuit 240 may include a compact disk drive using light. In an embodiment, the supplementary storage circuit 240 may be used, when massive data is intended to be stored instead of requiring a high speed, as compared with the main storage circuit 235. The supplementary storage circuit 240 is irrelevant to being random/non-random and may include a non-volatile memory device.

In an embodiment, the supplementary storage circuit 240 may include a semiconductor device. The input signal processing circuit 245 may convert an external command into an electrical signal or may transfer, to the microprocessor 230, an electrical signal transferred from the outside.

The command or electrical signal transferred from the outside may be an operation command, an electrical signal to be processed, or data to be stored. In an embodiment, the input signal processing circuit 245 may include, for example, a terminal signal processing circuit, which processes signals transmitted from a mouse, a touch pad, an image recognition device, or various sensors, an image signal processing circuit, which processes an image signal input from a scanner or a camera, various sensors or input signal interfaces, or the like. In an embodiment, the input signal processing circuit 245 may include a semiconductor device.

The output signal processing circuit 250 may be a component for transmitting an electrical signal processed by the microprocessor 230 to the outside. For example, in an embodiment the output signal processing circuit 250 may include a graphics card, an image processor, an optical converter, a beam panel card, a multi-functional interface circuit, or the like. In an embodiment, the output signal processing circuit 250 may include a semiconductor device.

The communicating signal processing circuit 255 is a component for directly exchanging signals with other electronic systems or other circuit boards without passing through the input signal processing circuit 245 or the output signal processing circuit 250. For example, in an embodiment the communicating signal processing circuit 255 may include a modem of a personal computer system, a local area network (LAN) card, various interface circuits. or the like. In an embodiment, the communicating signal processing circuit 255 may include a semiconductor device.

Figure 18:
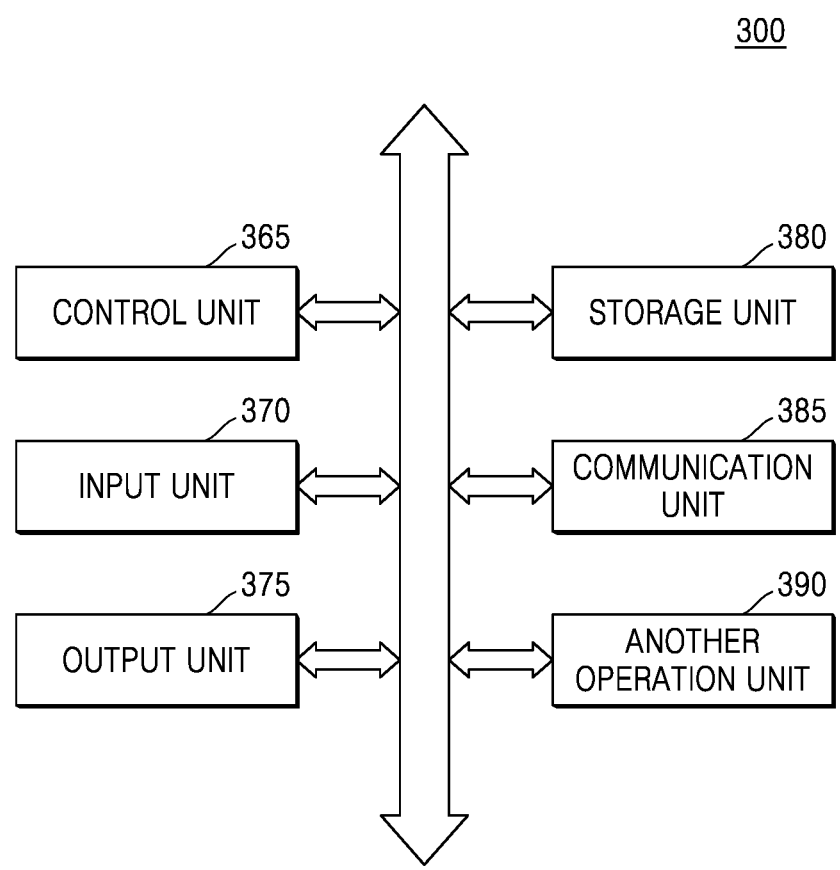
FIG. 18 is a block diagram schematically illustrating an electronic system including a semiconductor device, according to an embodiment of the present inventive concept.

FIG. 18 is a block diagram schematically illustrating an electronic system including a semiconductor device, according to an embodiment of the present inventive concept.

In an embodiment, an electronic system 300 may include a control unit 365, an input unit 370, an output unit 375, and a storage unit 380, and may further include a communication unit 385 and/or another operation unit 390.

The control unit 365 may collectively control the electronic system 300 and respective components thereof. In an embodiment, the control unit 365 may be a CPU or a central control unit and may include the electronic circuit board 200 (see FIG. 17). In addition, in an embodiment the control unit 365 may include a semiconductor device.

The input unit 370 may transmit an electrical command signal to the control unit 365. In an embodiment, the input unit 370 may include a keyboard, a keypad, a mouse, a touch pad, an image recognizer such as a scanner, or various input sensors. In an embodiment, the input unit 370 may include a semiconductor device.

The output unit 375 may receive an electrical command signal from the control unit 365 and output a result processed by the electronic system 300. In an embodiment, the output unit 375 may include a monitor, a printer, a beam irradiator, or various mechanical devices. In an embodiment, the output unit 375 may include a semiconductor device.

The storage unit 380 may be a component for temporarily or permanently storing an electrical signal processed or to be processed by the control unit 365. The storage unit 380 may be physically or electrically connected or coupled to the control unit 365. In an embodiment, the storage unit 380 may include a semiconductor memory, a magnetic storage device such as a hard disk, an optical storage device such as a compact disk, or a server having a data storage function. In addition, in an embodiment the storage unit 380 may include a semiconductor device.

The communication unit 385 may receive an electrical command signal from the control unit 365 and may transmit an electrical signal to or receive an electrical signal from another electronic system. In an embodiment, the communication unit 385 may include a wired transmission-reception device such as a modem or a LAN card, a wireless transmission-reception device such as a WiBro interface, an infrared port, or the like. In addition, in an embodiment, the communication unit 385 may include a semiconductor device.

The other operation unit 390 may perform a physical or mechanical operation according to a command from the control unit 365. For example, the other operation unit 390 may be a component for performing a mechanical operation, such as a plotter, an indicator, or an up/down operator. In an embodiment, the electronic system 300 may include a computer, a network server, a networking printer or scanner, a wireless controller, a mobile communication terminal, an exchanger, or other electronic devices performing programmed operations.

In addition, the electronic system 300 may be used in a mobile phone, an MP3 player, a navigation system, a portable multimedia player (PMP), a solid-state disk (SSD), or household appliances.

Figure 19:
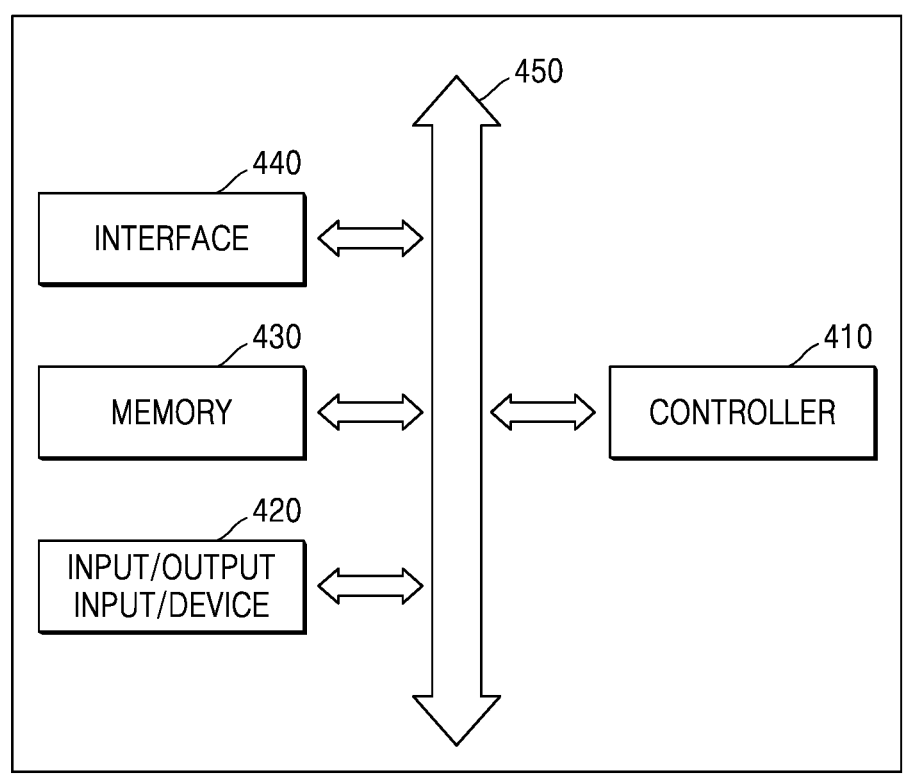
FIG. 19 is a schematic diagram illustrating an electronic system including a semiconductor device, according to an embodiment of the present inventive concept.

FIG. 19 is a schematic diagram illustrating an electronic system including a semiconductor device, according to an embodiment of the present inventive concept.

In an embodiment, an electronic system 400 may include a controller 410, an input/output device 420, a memory 430, and an interface 440. The electronic system 400 may include a mobile system, or a system transmitting or receiving information. The mobile system may include a personal digital assistant (PDA), a portable computer, a web tablet, a wireless phone, a mobile phone, a digital music player, or a memory card.

The controller 410 may execute a program and control the electronic system 400. In an embodiment, the controller 410 may include a semiconductor device. In an embodiment, the controller 410 may include, for example, a microprocessor, a digital signal processor, a microcontroller, or a device similar thereto.

The input/output device 420 may be used to input or output data of the electronic system 400. By using the input/output device 420, the electronic system 400 may be connected to an external device, for example, a personal computer or a network, and exchange data with the external device. In an embodiment, the input/output device 420 may include, for example, a keypad, a keyboard, or a display.

The memory 430 may store code and/or data for operations of the controller 410 and/or may store data processed by the controller 410. In an embodiment, the memory 430 include a semiconductor device. The interface 440 may be a data transfer path between the electronic system 400 and another device external thereto. The controller 410, the input/output device 420, the memory 430, and the interface 440 may communicate with each other through a bus 450.

For example, the electronic system 400 may be used in a mobile phone, an MP3 player, a navigation system, a PMP, an SSD, or household appliances.

While the present inventive concept has been particularly shown and described with reference to embodiments thereof, it will be understood that various changes in form and details may be made therein without departing from the spirit and scope of the present inventive concept.

What is claimed is:

1. A semiconductor device comprising:
a substrate;
a wiring layer over the substrate;
a first via structure directly contacting a lower portion of the wiring layer, the first via structure comprises a first via metal layer and a first barrier metal layer surrounding the first via metal layer, the first barrier metal layer directly contacting an entirety of a bottom surface of the first via metal layer; and
a second via structure directly contacting an upper portion of the wiring layer, the second via structure comprises a second via metal layer and a second barrier metal layer surrounding the second via metal layer, the second barrier metal layer directly contacting an entirety of a bottom surface of the second via metal layer,
wherein the first via structure generates first stress in the wiring layer,
the second via structure generates second stress in the wiring layer, the second stress is of an opposite type to the first stress, and
the first stress and the second stress compensate for each other in the wiring layer.

2. The semiconductor device of claim 1, wherein the first barrier metal layer generates the first stress.

3. The semiconductor device of claim 1, wherein the second barrier metal layer generates the second stress.

4. The semiconductor device of claim 1, wherein the first via structure is arranged over the substrate to be spaced apart from the second via structure in a horizontal direction.

5. The semiconductor device of claim 1, wherein the first via structure is arranged over the substrate to overlap the second via structure in a vertical direction.

6. The semiconductor device of claim 1, wherein:
the first via structure comprises the first barrier metal layer generating the first stress in the wiring layer, the first stress comprising tensile stress; and
the second via structure comprises the second barrier metal layer generating the second stress in the wiring layer, the second stress comprising compressive stress.

7. The semiconductor device of claim 1, wherein:
the first via structure comprises the first barrier metal layer generating the first stress in the wiring layer, the first stress comprising compressive stress; and
the second via structure comprises the second barrier metal layer generating the second stress in the wiring layer, the second stress comprising tensile stress.

8. The semiconductor device of claim 1, wherein:
the first via structure comprises a plurality of first sub-via structures arranged to be spaced apart from each other, and
the second via structure comprises a plurality of second sub-via structures arranged to be spaced apart from each other.

9. The semiconductor device of claim 1, wherein:
the first barrier metal layer generates the first stress and the second barrier metal layer generates the second stress; and
one of the first stress and the second stress is in a range of about 1.0 GPa to about 2.0 GPa and the other of the first stress and the second stress is in a range of about −1.0 GPa to about −2.0 GPa.

10. The semiconductor device of claim 1, wherein the second stress that is an opposite type to the first stress has a substantially same magnitude as the first stress.

11. A semiconductor device comprising:
a substrate;
a lower interlayer insulating layer over the substrate;
a first via structure comprising a first barrier metal layer that is arranged on an inner wall and a bottom of a first via hole, and a first via metal layer that is arranged on the first barrier metal layer to fill the first via hole, the first via hole is defined in the lower interlayer insulating layer, wherein the first barrier metal layer directly contacts an entirety of a bottom surface of the first via metal layer;
a wiring layer arranged on the lower interlayer insulating layer and the first via structure;
an upper interlayer insulating layer on the wiring layer; and
a second via structure comprising a second barrier metal layer that is arranged on an inner wall and a bottom of a second via hole, and a second via metal layer that is arranged on the second barrier metal layer to fill the second via hole, the second via hole is defined in the upper interlayer insulating layer, wherein the second barrier metal layer directly contacts an entirety of a bottom surface of the second via metal layer,
wherein the first barrier metal layer generates first stress in the wiring layer,
the second barrier metal layer generates second stress in the wiring layer, the second stress is an opposite type to the first stress, and
the first stress and the second stress compensate for each other in the wiring layer.

12. The semiconductor device of claim 11, wherein:
an upper portion of the first via structure directly contacts a lower portion of the wiring layer; and
a lower portion of the second via structure directly contacts an upper portion of the wiring layer.

13. The semiconductor device of claim 11, wherein:
the first barrier metal layer generates the first stress in the wiring layer, the first stress comprising tensile stress;
the second barrier metal layer generates the second stress in the wiring layer, the second stress comprising compressive stress; and
the first barrier metal layer and the second barrier metal layer respectively comprise same films.

14. The semiconductor device of claim 11, wherein:
the first barrier metal layer generates the first stress in the wiring layer, the first stress comprising compressive stress;
the second barrier metal layer generates the second stress in the wiring layer, the second stress comprising tensile stress; and
the first barrier metal layer and the second barrier metal layer respectively comprise same films.

15. The semiconductor device of claim 11, wherein the first via structure is arranged over the substrate to be spaced apart from the second via structure in a horizontal direction.

16. The semiconductor device of claim 11, wherein:
the first barrier metal layer comprises a first sub-barrier metal layer that is arranged on the first via hole, and a second sub-barrier metal layer that is arranged on the first sub-barrier metal layer; and
the second barrier metal layer comprises a third sub-barrier metal layer that is arranged on the second via hole, and a fourth sub-barrier metal layer that is arranged on the third sub-barrier metal layer.

17. The semiconductor device of claim 11, wherein:
the first via structure comprises a plurality of first sub-via structures arranged to be spaced apart from each other; and
the second via structure comprises a plurality of second sub-via structures arranged to be spaced apart from each other.

18. A semiconductor device comprising:
a substrate;
a first interlayer insulating layer over the substrate;
a first wiring layer disposed in the first interlayer insulating layer;
a second interlayer insulating layer arranged on the first interlayer insulating layer and the first wiring layer;
a first via structure comprising a first barrier metal layer that is arranged on an inner wall and a bottom of a first via hole to directly contact the first wiring layer, and a first via metal layer that is arranged on the first barrier metal layer to fill the first via hole, the first barrier metal layer directly contacts an entirety of a bottom surface of the first via metal layer, the first via hole is defined in the second interlayer insulating layer to expose the first wiring layer;
a second wiring layer arranged on the second interlayer insulating layer and the first via structure and directly contacting the first via structure;
a third interlayer insulating layer on the second wiring layer;
a second via structure comprising a second barrier metal layer that is arranged on an inner wall and a bottom of a second via hole to directly contact the second wiring layer, and a second via metal layer that is arranged on the second barrier metal layer to fill the second via hole, the second barrier metal layer directly contacts an entirety of a bottom surface of the second via metal layer, the second via hole is defined in the third interlayer insulating layer to expose the second wiring layer; and
a third wiring layer arranged on the third interlayer insulating layer and the second via structure and directly contacting the second via structure,
wherein the first barrier metal layer generates first stress in the second wiring layer,
the second barrier metal layer generates second stress in the second wiring layer, the second stress is of an opposite type to the first stress, and
the first stress and the second stress compensate for each other in the second wiring layer.

19. The semiconductor device of claim 18, wherein:
the first wiring layer is arranged over the substrate to extend in a second direction that is parallel to an upper surface of the substrate;
the second wiring layer is arranged over the substrate to extend in a first direction that is perpendicular to the second direction and parallel to an upper surface of the substrate; and
the third wiring layer is arranged over the substrate to extend in the second direction.

20. The semiconductor device of claim 19, wherein the first via structure is arranged over the substrate to be horizontally spaced apart from the second via structure in the first direction or the second direction.

21. The semiconductor device of claim 18, wherein:
the first barrier metal layer generates the first stress in the second wiring layer, the first stress comprising tensile stress;

the second barrier metal layer generates the second stress in the second wiring layer, the second stress comprising compressive stress; and the first barrier metal layer and the second barrier metal layer respectively comprise same films.

22. The semiconductor device of claim 18, wherein:

the first barrier metal layer generates the first stress in the second wiring layer, the first stress comprising compressive stress;

the second barrier metal layer generates the second stress in the second wiring layer, the second stress comprising tensile stress; and the first barrier metal layer and the second barrier metal layer respectively comprise same films.

* * * * *